United States Patent
Arayashiki et al.

(10) Patent No.: US 7,450,921 B2
(45) Date of Patent: *Nov. 11, 2008

(54) COMMUNICATION SEMICONDUCTOR INTEGRATED CIRCUIT DEVICE FOR USE IN A MOBILE COMMUNICATION DEVICE FOR CORRECTING VARIATIONS IN THE OSCILLATION FREQUENCY OF A TRANSMISSION OSCILLATOR BY CALIBRATING A CURRENT OF THE CHARGE PUMP

(75) Inventors: Satoshi Arayashiki, Takasaki (JP);
Hirotaka Oosawa, Isesaki (JP);
Noriyuki Kurakami, Maebashi (JP);
Akira Okasaka, Takasaki (JP);
Yasuyuki Kimura, Maebashi (JP);
Toshiya Uozumi, Takasaki (JP);
Hirokazu Miyagawa, Takasaki (JP);
Satoshi Tanaka, Tamamura (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/651,993

(22) Filed: Jan. 11, 2007

(65) Prior Publication Data
US 2007/0111675 A1      May 17, 2007

Related U.S. Application Data

(63) Continuation of application No. 10/862,626, filed on Jun. 8, 2004, now Pat. No. 7,187,911.

(30) Foreign Application Priority Data
Sep. 17, 2003   (JP)   .............................. 2003-323995

(51) Int. Cl.
*H04B 1/04* (2006.01)

(52) U.S. Cl. ...................... 455/260; 455/114.2; 375/327
(58) Field of Classification Search ................. 455/126, 455/260, 127.1, 127.2, 93, 114.2, 110, 113, 455/264; 332/162; 375/327
See application file for complete search history.

(56) References Cited

U.S. PATENT DOCUMENTS 5,631,587 A * 5/1997 Co et al. ...................... 327/107

(Continued)

FOREIGN PATENT DOCUMENTS

JP          20047443          1/2004

(Continued)

OTHER PUBLICATIONS

P. Kenington, "High Linearity RF Amplifier Design", ARTECH House Inc., 1979, pp. 160-165.

*Primary Examiner*—Blane J Jackson
(74) *Attorney, Agent, or Firm*—Mattingly, Stanger, Malur & Brundidge, P.C.

(57) ABSTRACT

The invention provides a communication semiconductor integrated circuit (RF IC) that, when a transmission oscillator is incorporated into a semiconductor chip, secures the oscillation operation over a wide frequency range, prevents a deterioration of a transmission spectrum, and thereby enhances the accuracy of an oscillation frequency. The integrated circuit corrects a dispersion of the KV characteristic of the transmission oscillator by calibrating a current Icp of the charge pump inside the phase control loop. More in concrete, the integrated circuit measures a KV value Kv of the transmission oscillator, and calibrates the current Icp of the charge pump so that Kv·Icp falls into a predetermined value.

11 Claims, 9 Drawing Sheets

U.S. PATENT DOCUMENTS

| | | | |
|---|---|---|---|
| 6,826,246 B1 * | 11/2004 | Brown et al. | 375/376 |
| 6,844,788 B2 | 1/2005 | Chadwick | 332/159 |
| 6,853,836 B2 | 2/2005 | Asam et al. | 455/126 |
| 6,917,791 B2 | 7/2005 | Chadwick | 455/126 |
| 7,062,236 B2 | 6/2006 | Midtgaard et al. | 455/126 |
| 7,088,968 B2 | 8/2006 | Zipper | 455/126 |
| 7,120,412 B2 * | 10/2006 | Anand | 455/260 |
| 2003/0224740 A1 | 12/2003 | Takano et al. | |
| 2004/0051095 A1 | 3/2004 | Oosawa et al. | |
| 2004/0053591 A1 * | 3/2004 | Lin | 455/260 |

FOREIGN PATENT DOCUMENTS

| | | |
|---|---|---|
| JP | 2004112749 | 4/2004 |

* cited by examiner

COMMUNICATION SEMICONDUCTOR INTEGRATED CIRCUIT DEVICE FOR USE IN A MOBILE COMMUNICATION DEVICE FOR CORRECTING VARIATIONS IN THE OSCILLATION FREQUENCY OF A TRANSMISSION OSCILLATOR BY CALIBRATING A CURRENT OF THE CHARGE PUMP

CROSS-REFERENCE TO RELATED APPLICATION

The present application is a continuation of application Ser. No. 10/862,626, filed Jun. 8, 2004, now U.S. Pat. No. 7,187,911; which claims priority from Japanese Application Patent No. JP 2003-323995, filed Sep. 17, 2003, the content of which is incorporated by reference.

BACKGROUND OF THE INVENTION

The present invention relates to a technique effective in an application to incorporating a voltage controlled oscillator (VCO) capable of switching an oscillation frequency into a semiconductor chip, specifically to a technique effective in use for a control loop of a transmission VCO in a high frequency semiconductor integrated circuit that modulates or up-converts a transmission signal, which is used in a radio communication device such as a mobile telephone capable of transmitting and receiving signals of plural bands.

There is a system called the GSM (Global System for Mobile Communication), which is used in the field of the radio communication device (mobile communication device) such as a mobile telephone, etc. This GSM system generally employs the phase modulation system called the GMSK (Gaussian Minimum Shift Keying) that shifts the phase of a carrier according to transmission data.

Now, in the recent mobile telephone of the GSM system, etc., a system called the EDGE (Enhanced Data Rates for GMS Evolution) has been used in practice in addition to the GMSK modulation mode. This new modulation system has the $3\pi/8$ rotating8-PSK (phase shift keying) modulation mode that modulates the phase component and the amplitude component of a carrier. In contrast to the GMSK system that transmits information of one bit per one symbol, the $3\pi/8$ rotating8-PSK (hereunder, called 8-PSK) modulation system is able to send information of 3 bits per one symbol. Thus, the EDGE mode is possible of a communication at a higher transmission rate (384K bps) in comparison to the GMSK mode.

As a means of realizing the modulation system that makes the phase component and the amplitude component of a transmission signal each carry information, there is a system called the polar loop, which is conventionally known. This system separates a transmission signal into the phase component and the amplitude component, and then applies feedbacks to the phase component and the amplitude component with a phase control loop and an amplitude control loop, respectively. Thereafter, an amplifier outputs to synthesize the above controlled signals (for example, Page 162, "High Linearity RF Amplifier Design" by Kenington, Peter B, Published by ARTECH HOUSE, Inc. 1979).

In recent years, in order to downsize the device and reduce the cost by decreasing the number of components in the radio communication system, many efforts and struggles have been made to incorporate as many circuits as possible into one or few semiconductor integrated circuits. As an example, there is a trial to incorporate a transmission oscillator into the semiconductor integrated circuit that possesses the modulation/demodulation function (hereunder, called RF IC). In regard to the RF IC for making up a communication system of the GSM system, the present applicant, etc. have developed and proposed the one that mounts a transmission oscillator on a semiconductor chip (Patent Document 1).

[Patent Document 1]
Ser. No. 10/373046, date of application to the US patent office: Feb. 26, 2003

SUMMARY OF THE INVENTION

The inventors examined a technique that incorporates a transmission oscillator into an RF IC configuring the communication system of the EDGE system. As the result, the examination discovered the following problems. Here, the inventors examined the polar loop system used in the EDGE system, and the system detects, with regard to the phase control loop, an output of the transmission oscillator or an output of the RF power amplification circuit (hereunder, called power amplifier), and feeds back the output to a phase comparator that compares the output with a reference signal. And, with regard to the amplitude control loop, the system detects the output of the power amplifier, and feeds back the output to an amplitude comparator that compares the output with a reference signal. The present applicant, etc. have disclosed the above polar loop system in the patent application (Ser. No. 10/373031, date of application to the US patent office: Feb. 26, 2003).

Now, there has been the mobile telephone of the dual band system capable of handling the signals of two frequency bands, such as the 880~915 MHz band of the GSM and the 1710~1785 MHz band of the DCS (Digital Cellar System). And, there are some mobile telephones of the above dual band system that meet the two systems, by preparing two transmission oscillators (hereunder, called transmission VCOs) corresponding to the respective frequency bands, and switching the transmission VCOs.

In recent years, however, the market demands the mobile telephone of a triple band system, for example, capable of handling the signal of the 1850~1915 MHz band of the PCS (Personal Communication System) in addition to the GSM and DCS. And the market demand is estimated to increase toward the mobile telephone that meets still more systems. The transmission VCO used in the mobile telephone that meets plural systems is required to have a wide oscillation band (frequency range possible of oscillation).

On the other hand, the Q-factor of the passive elements on the semiconductor chip, such as inductors and so forth, plays a significant role in governing the performance of the transmission VCO built in the semiconductor chip. The Q-factor of the passive elements formed on the semiconductor chip becomes necessarily lower than the Q-factor of the discrete components, which is inevitable with the present semiconductor manufacturing technique. And some of them use externally mounted elements. But this cannot achieve a sufficient reduction of the number of components. Therefore, to mount the elements including the inductors on one chip is imperative.

However, since the Q-factor of the passive elements mounted on a chip is lower, the oscillation band of the VCO becomes narrower than the oscillation band of an oscillation module made up with discrete components, which is disadvantageous. In order to solve such a problem, the priorly filed invention (Ser. No. 10/373046, date of application to the US patent office: Feb. 26, 2003) adopts the transmission VCO of the multi-band system. This system provides such a configuration that gradually varies the capacitances of the transmission VCO, and selects any of the capacitances according to the usable frequency band to thereby switch the oscillation frequencies.

However, the priorly filed invention is confined to the technique for incorporating a transmission VCO into an RF IC for the GSM system that supports only the GMSK modulation. The inventors examined the technical problems appearing in incorporating the transmission VCO of the multi-band system into the RF IC for the EDGE system. As the result, the examination discovered that, as the capacitances of the on-chip capacitors constituting the transmission VCO deviate from the design value due to the manufacturing dispersions, the KV characteristic (voltage vs. frequency sensitivity) of each band deviates from the desired characteristic, which varies the loop gain of the control loop. Thereby, the EVM (Error Vector Magnitude) deteriorates, and also the spectral regrowth (transmission spectrum) inevitably deteriorates, which signifies the attenuation of a signal level at the frequency deviating by 0.4 MHz from the carrier frequency.

Now, as the EVM deteriorates, the modulation accuracy decreases; and as the spectral regrowth deteriorates, the leakage of noises into the adjacent channels increases. Therefore, it is necessary to prevent both the deterioration of the EVM and the deterioration of the transmission spectrum as much as possible. Here, in the polar loop system that executes the phase control and the amplitude control separately, the signal of the transmission VCO only contains the phase modulation component, and does not contain the amplitude modulation component. But nevertheless, the EVM deteriorates due to the dispersion of the KV characteristic of the transmission VCO. The reason is considered such that there is a close relation between the phase and the amplitude in the PSK modulation, and the error of the phase affects the error of the amplitude.

It is therefore an object of the invention to provide, when a transmission oscillator is incorporated into a semiconductor chip, a communication semiconductor integrated circuit (RF IC) capable of securing the oscillation operation over a wide frequency range, and enhancing the accuracy of the oscillation frequency.

Another object of the invention is to provide, when a transmission oscillator is incorporated into a semiconductor chip, a communication semiconductor integrated circuit (RF IC) capable of preventing the deterioration of the EVM and the deterioration of the transmission spectrum, due to the variation of the KV characteristic of the transmission oscillator accompanied with the manufacturing dispersions.

Another object of the invention is to provide a technique effective in use for incorporating a transmission oscillator into a communication semiconductor integrated circuit that configures the EDGE system to execute the phase modulation and the amplitude modulation.

The foregoing and other objects and the novel features of the invention will become apparent from the descriptions and appended drawings of this specification.

An outline of representative ones of inventions disclosed in the specification will be briefly described as follows.

According to one aspect of the invention, in the phase control loop including the transmission oscillator (transmission VCO), the communication semiconductor integrated circuit corrects a dispersion of the KV characteristic of the transmission VCO by calibrating a current Icp of a charge pump inside the phase control loop. More in concrete, the integrated circuit measures a KV value Kv (oscillation frequency range/control voltage range) of the transmission VCO, and calibrates the current Icp of the charge pump so that Kv·Icp falls into a predetermined value. And, in correcting the dispersion of the KV characteristic of the transmission VCO by the current Icp of the charge pump, if the current Icp of the charge pump has a deviation, a correct calibration will not be achieved. Therefore, the integrated circuit first measures the current Icp of the charge pump and corrects the deviation of the current Icp, prior to correcting the KV characteristic of the transmission VCO.

According to the above means, in the phase control loop including the transmission VCO, when the KV characteristic of the transmission VCO disperses, the current Icp of the charge pump is calibrated so that Kv·Icp falls into a constant value, which makes it possible to prevent the deterioration of the EVM and enhance the modulation accuracy.

Especially, the invention is effective in use for incorporating a transmission oscillator into the communication semiconductor integrated circuit that configures the EDGE system to execute the phase control and amplitude control of the 8-PSK-modulation system by the polar loop system. The reason is as follows.

In the polar loop system, if the KV characteristic of the transmission VCO deviates, the loop gain of the phase control loop will vary; accordingly, there is the apprehension that the transmission spectrum deteriorates. Concretely, the frequency characteristic of the loop gain of the phase control loop having two poles $\omega p1$, $\omega p2$ and one zero point $\omega z$ is shown in FIG. 12. Since the positions of the poles and the zero point are fixed by the loop filter, if the KV characteristic of the transmission VCO deviates, the frequency characteristic of the loop gain will shift up and down as shown by the dotted lines in the drawing. Therefore, the noise suppression of the phase control loop fluctuates due to the dispersion of the KV characteristic, which invites deterioration of the transmission spectrum. Therefore, the above means is able to enhance the transmission spectrum by correcting the dispersion of the KV characteristic of the transmission VCO.

And in the polar loop system, the transmission signal is divided into the phase component and the amplitude component, which are controlled by the phase control loop and the amplitude control loop, respectively; thereafter, they are synthesized and outputted by the power amplifier. Therefore, if the frequency band of the phase component is not coincident with the frequency band of the amplitude component, the modulation accuracy will deteriorate. Table 1 shows a simulation result of the modulation accuracy (EVM), in which the transmission circuit adopting the polar loop system is operated by the 8-PSK modulation mode, while the frequency bands of the phase control loop and the amplitude control loop are varied in many ways.

TABLE 1

| | | PM Loop Open Loop Bandwidth (MHz) | | | | |
|---|---|---|---|---|---|---|
| | | 0.647 | 1.151 | 1.8 | 2.047 | 3.639 | 6.467 |
| AM Loop Open Loop Bandwidth (MHz) | 0.647 | 5.99 | | | | | 4.84 |
| | 1.151 | | 2.03 | | 1.38 | 1.30 | 1.29 |
| | 1.8 | | | | | | |
| | 2.047 | | 1.64 | | 0.65 | 0.45 | 0.42 |
| | 3.639 | | 1.60 | | 0.51 | 0.20 | 0.14 |
| | 6.467 | 3.69 | 1.59 | | 0.51 | 0.16 | 0.06 |

(%)

Table 2 shows the spectral regrowth attained by the simulation of the similar condition.

TABLE 2

| | PM Loop Open Loop Bandwidth (MHz) | | | | | |
|---|---|---|---|---|---|---|
| | | 0.647 | 1.151 | 1.8 | 2.047 | 3.639 | 6.467 |
| AM Loop Open Loop Bandwidth (MHz) | 0.647 | −46 | | | | | −42 |
| | 1.151 | | −50 | | −54 | −52 | −51 |
| | 1.8 | | | | | | |
| | 2.047 | | −47 | | −60 | −61 | −59 |
| | 3.639 | | −46 | | −58 | −69 | −68 |
| | 6.467 | −41 | −46 | | −57 | −69 | −73 |

(dBm/100 kHz)

In Table 1 and Table 2, the values on the diagonal line from the upper left toward the lower right are those to show the state that the frequency bands of the two control loops are coincident. Table 1 and Table 2 confirm that, as the frequency bands of the phase control loop and the amplitude control loop are more approximate to coincidence, the modulation accuracy and the spectral regrowth become better. Therefore, it is preferred that the frequency band of the phase control loop and the frequency band of the amplitude control loop are set to an identical band (for example, carrier frequency ±1.8 MHz) in each of the loop filters.

Although the frequency bands are set in such a manner, if the KV characteristic of the transmission VCO disperses and the relation between the oscillation frequency range of the VCO and the loop band of the phase control loop deviates from the desired relation, the relation between the oscillation frequency range of the VCO and the loop band of the amplitude control loop will deviate from the desired relation. Therefore, there is the apprehension that the phase control accuracy and the amplitude control accuracy deteriorate. However, by correcting the Kv·Icp of the VCO, the relation between the oscillation frequency range of the VCO and the loop band of the phase control loop and the relation between the oscillation frequency range of the VCO and the loop band of the amplitude control loop can be made to fall into the desired relation.

Thereby, it is possible to enhance not only the phase control accuracy but also the amplitude control accuracy.

Effects obtained by representative inventions disclosed in the specification will be briefly described as follows.

According to the invention, since the transmission oscillator (TXVCO) is configured in a multi-band, when the TXVCO is incorporated into a semiconductor chip, the TXVCO achieves an oscillation operation over a wide frequency range. And if the KV value deviates due to the capacitance dispersions of the capacitors, the deviation can be corrected, and the accuracy of the oscillation frequency can be enhanced.

Further, in case the TXVCO is incorporated into a communication semiconductor integrated circuit (RF IC) that configures the EDGE system to execute the modulation of the phase component and the modulation of the amplitude component, if the KV characteristic of the TXVCO deviates from the desired characteristic due to the manufacturing dispersions, the EVM will deteriorate and the transmission spectrum will also deteriorate. However, applying the above embodiment will correct the deviation of the KV value of the TXVCO. Therefore, it is possible to improve the EVM and enhance the modulation accuracy, and to prevent the transmission spectrum from deteriorating.

DETAILED DESCRIPTION OF THE PREFERRED EMBODIMENTS

Next, the embodiment of the invention will be described with the accompanying drawings.

Figure 1:
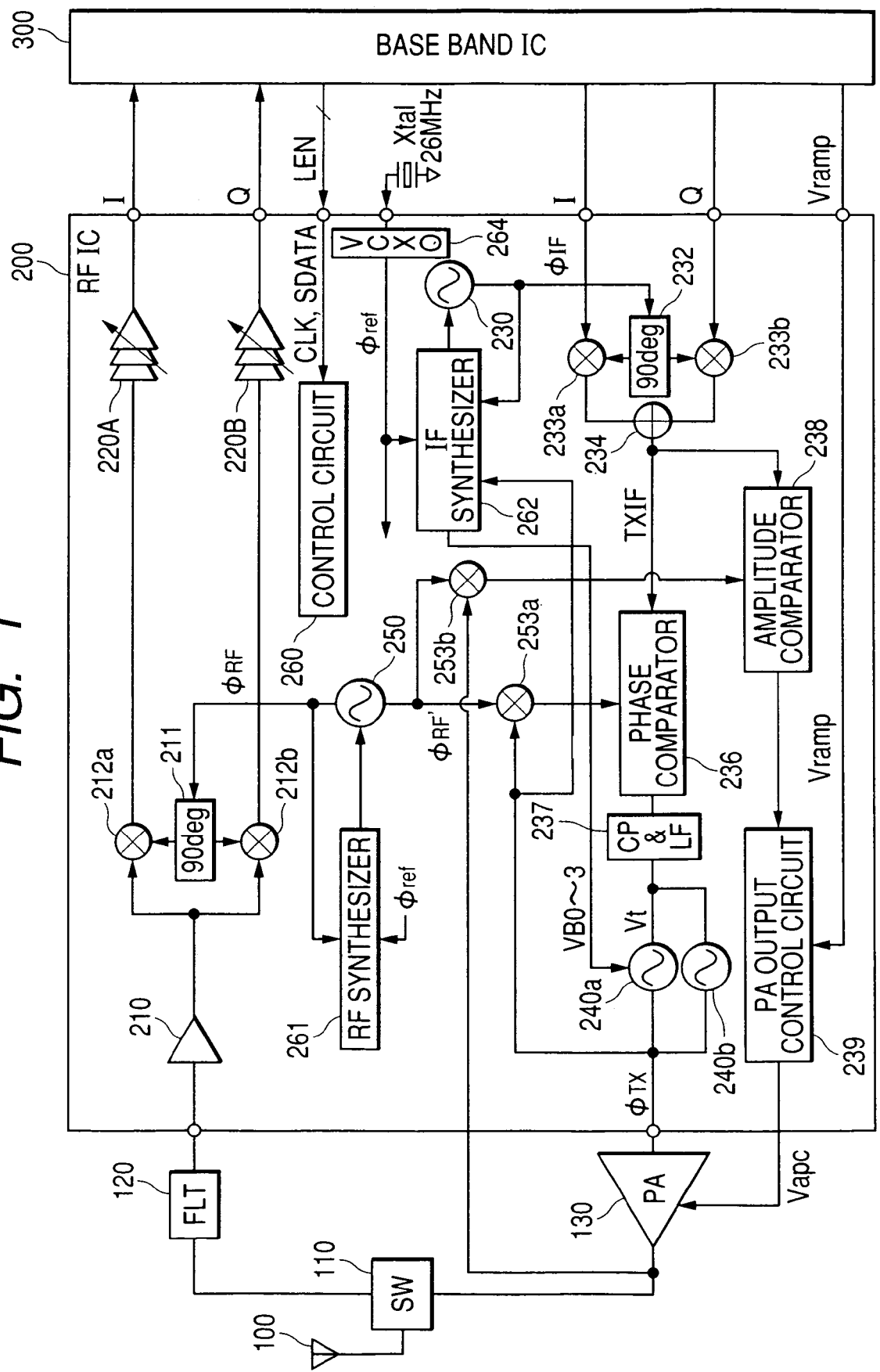
FIG. 1 shows a circuit configuration of a communication semiconductor integrated circuit (RF IC) of the multi-band system relating to one embodiment of the present invention, and it also shows a configuration example of a radio communication system using the RF IC.

FIG. 1 is a block diagram that shows one embodiment of a communication semiconductor integrated circuit (RF IC) incorporating a transmission oscillator relating to the invention, and a configuration example of a radio communication system using the RF IC. This embodiment was applied to a radio communication system of the EDGE system that executes the 8-PSK modulation by the so-called polar loop system having the phase control loop and the amplitude control loop.

The radio communication system shown in FIG. 1 includes an antenna 100 that transmits/receives radio wave signals, a switch 110 that switches the transmission/reception, a band pass filter 120 that removes undesired signals from a reception signal, being made up with a SAW filter and so forth, an RF power amplification circuit (power amplifier) 130 that amplifies a transmission signal, an RF IC 200 that demodulates the reception signal and modulates the transmission signal, and a base band circuit 300 that converts transmission data into I, Q signal, and controls the RF IC 200. In this embodiment, the RF IC 200 and the base band circuit 300 are each formed on separate semiconductor chips, as respective semiconductor integrated circuits.

The RF IC 200 of this embodiment is configured to be capable of modulating/demodulating the signal according to the four communication systems, GSM 850, GSM 900, DCS 1800, and PCS 1900, which is not specifically restricted. And to correspond with the above configuration, the band pass filter 120 is composed of a filter that the reception signal within the frequency band of the GSM system is passed through, a filter that the reception signal within the frequency band of the DCS 1800 is passed through, and a filter that the reception signal within the frequency band of the PCS 1900 is is passed through.

The RF IC 200 of this embodiment is broadly divided into the reception system circuit, the transmission system circuit, and the control system circuit composed of the circuits common to the transmission/reception system, such as control circuits and clock circuits other than the former two.

The reception system circuit includes a low noise amplifier 210 that amplifies the reception signal, a frequency divider/phase shifter 211 that divides the frequency of an oscillation signal φRF generated by an RF oscillator (RFVCO) 250, and generates orthogonal signals having 90° phase shift to each other, a demodulation circuits 212a, 212b constituting a mixer that demodulates the reception signal by mixing the reception signal amplified by the low noise amplifier 210 with the orthogonal signals generated by the frequency divider/phase shifter 211, high gain amplifiers (PGA) 220A, 220B that amplify the demodulated I, Q signals, respectively, and output them to the base band circuit 300.

The transmission system circuit TXC includes an oscillator (IFVCO) 230 that generates an oscillation frequency φIF of the intermediate frequency such as 640 MHz, a frequency divider/phase shifter 232 that divides the frequency of the oscillation frequency φIF generated by the oscillator (IFVCO) 230, and generates orthogonal signals having 90° phase shift to each other, a modulation circuits 233a, 233b constituting a mixer that modulates the generated orthogonal signals by the I signal and Q signal supplied from the base band circuit 300, an adder 234 that mixes the modulated signals, transmission oscillators (TXVCO) 240a, 240b that generate a transmission signal φTX of a predetermined frequency, an offset mixer 253a that mixes the transmission signal φTX (feedback signal) outputted from the transmission oscillators 240a, 240b with a signal φRF' acquired by dividing the frequency of the oscillation signal φRF generated by the RF oscillator (RFVCO) 250, and thereby generates a signal of a frequency equivalent to the frequency difference of the two signals (φTX, φRF'), a phase comparator 236 that compares an output from the offset mixer 253a and a signal TXIF mixed by the adder 234 to detect the frequency difference and the phase difference between the two signals, a charge pump & loop filter 237 that generates a voltage corresponding to the output from the phase comparator 236, a second offset mixer 235b that mixes a feedback signal acquired by extracting a transmission output from the RF power amplifier 130 by means of a coupler or the like with the signal φRF' generated by the RF oscillator (RFVCO) 250, and thereby generates a signal of a frequency equivalent to the frequency difference of these signals, an amplitude comparator 238 that compares an output of the second offset mixer 235b and the signal TXIF mixed by the adder 234 to detect an amplitude difference thereof, and a PA output control circuit 239 that generates a signal Vapc for controlling the gain of the RF power amplifier 130 on the basis of a voltage corresponding to the detected amplitude difference and an output level indicating signal Vramp from the base band IC 300 and so forth.

One of the transmission oscillators 240a, 240b generates the signal of the 850~900 MHz band for the GSM, and the other one generates the signal of the 1800~1900 MHz band for the DCS and PCS.

Further, the RF IC 200 of this embodiment includes on the chip thereof a control circuit 260 that controls the whole chip, an RF synthesizer 261 that constitutes an RF PLL circuit together with the RF oscillator (RFVCO) 250, an IF synthesizer 262 that constitutes an IF PLL circuit together with the oscillator (IFVCO) 230 for the intermediate frequency, and a reference oscillator (VCXO) 264 that generates a clock signal φref as the reference clock for these synthesizers 261, 262. The synthesizers 261, 262 are each configured with phase comparators and charge pumps and loop filters and so forth.

Since the reference oscillation signal φref is required to have high frequency accuracy, the reference oscillator (VCXO) 264 has a quartz resonator Xtal externally connected. With regard to the frequency of the reference oscillation signal φref, 26 MHz or 13 MHz is selected. The quartz resonator of such a frequency is a general-purpose component, and is readily available.

The control circuit 260 contains a control register, and the setting is executed to this control register on the basis of a signal from the base band IC 300. Concretely, the base band IC 300 supplies the RF IC 200 with a clock signal CLK for synchronization, a data signal SDATA, and a load enable signal LEN as the control signal. As the load enable signal LEN is asserted to the effective level, the control circuit 260 sequentially fetches the data signal SDATA being transmitted from the base band IC 300 synchronously with the clock signal CLK, and sets the signal to the control register. The data signal SDATA is transmitted in serial order, which is not specifically restricted. The base band IC is composed of a microprocessor and so forth.

The control register contained in the control circuit 260 includes the control bits for starting the frequency measurements of the VCOs in the RF oscillator (RFVCO) 250 and the intermediate frequency oscillator (IFVCO) 230, and the bit fields for designating the mode such as reception mode, transmission mode, idle mode, etc. Here, the idle mode signifies the sleep state that only extremely limited circuits are in operation during the wait state, and major part of the circuits including at least the oscillators are in halt.

In this embodiment, the phase comparator 236, charge pump & loop filter 237, transmission oscillators (TXVCO) 240a, 240b, and offset mixer 236 constitute a transmission PLL circuit (TXPLL) that executes the frequency conversion. In the radio communication system of the multi-band system in this embodiment, on the basis of the command from the base band IC 300, the control circuit 260 varies the frequency of the oscillation signal φRF of the RF oscillator (RFVCO) 250 in correspondence with the channel used, during the transmission and reception; and it also varies the frequency of the signal supplied to the offset mixers 235a, 235b in correspondence with the GSM mode or the DCS/PCS mode. Thereby, the switching of the transmission frequency is carried out.

On the other hand, the oscillation frequency of the RF oscillator (RFVCO) 250 is set to a different value in correspondence with the reception mode or the transmission mode. In the transmission mode, the oscillation frequency fRF of the RF oscillator (RFVCO) 250 is set to 3616~3716 MHz in case of the GSM 850, 3840~3980 MHz in case of the GSM 900, 3610~3730 MHz in case of the DCS, and 3860~3980 MHz in case of the PCS. The oscillation frequency fRF is divided into ¼ by the frequency divider in case of the GSM, and it is divided into ½ in case of the DCS and PCS, which is supplied to the offset mixers 235a, 235b.

The offset mixer 235a outputs a signal equivalent to a frequency difference (fRF−fTX) of the oscillation signal φRF from the RF oscillator (RFVCO) 250 and the transmission signal φTX from the transmission oscillators (TXVCO) 240a, 240b. In order that the frequency of the signal equivalent to the frequency difference becomes equal to the frequency of the modulation signal TXIF, the transmission PLL circuit (TXPLL) operates. In other words, the transmission oscillators (TXVCO) 240a, 240b are controlled to oscillate at a frequency equivalent to the difference between the frequency (fRF/4 in case of the GSM, fRF/2 in case of the DCS and PCS) of the oscillation signal φRF from the RF oscillator (RFVCO) 250 and the frequency of the modulation signal TXIF.

And in this embodiment, in order to calibrate the frequency of the transmission oscillators (TXVCO) 240a, 240b and to select the usable band, the signal φTX outputted from the transmission oscillators (TXVCO) 240a, 240b is supplied to the IF synthesizer 262, and band selection signals VB3~VB0 from the IF synthesizer 262 are supplied to the transmission oscillators (TXVCO) 240a, 240b.

In the RF IC of this embodiment, the KV value Kv (=oscillation frequency range/control voltage range) of the transmission VCO is measured, the current Icp of the charge pump is calibrated so that Kv·Icp falls into a predetermined value, and thereby the dispersion of the KV characteristic in the transmission VCO is corrected. When the dispersion of the KV characteristic in the transmission VCO is corrected by means of the current Icp of the charge pump, if the current Icp of the charge pump deviates, any correct calibration will not be possible. Therefore, before the correction of the KV characteristic in the transmission VCO, it is essential to measure the current of the charge pump first, and to correct the deviation.

Figure 2:
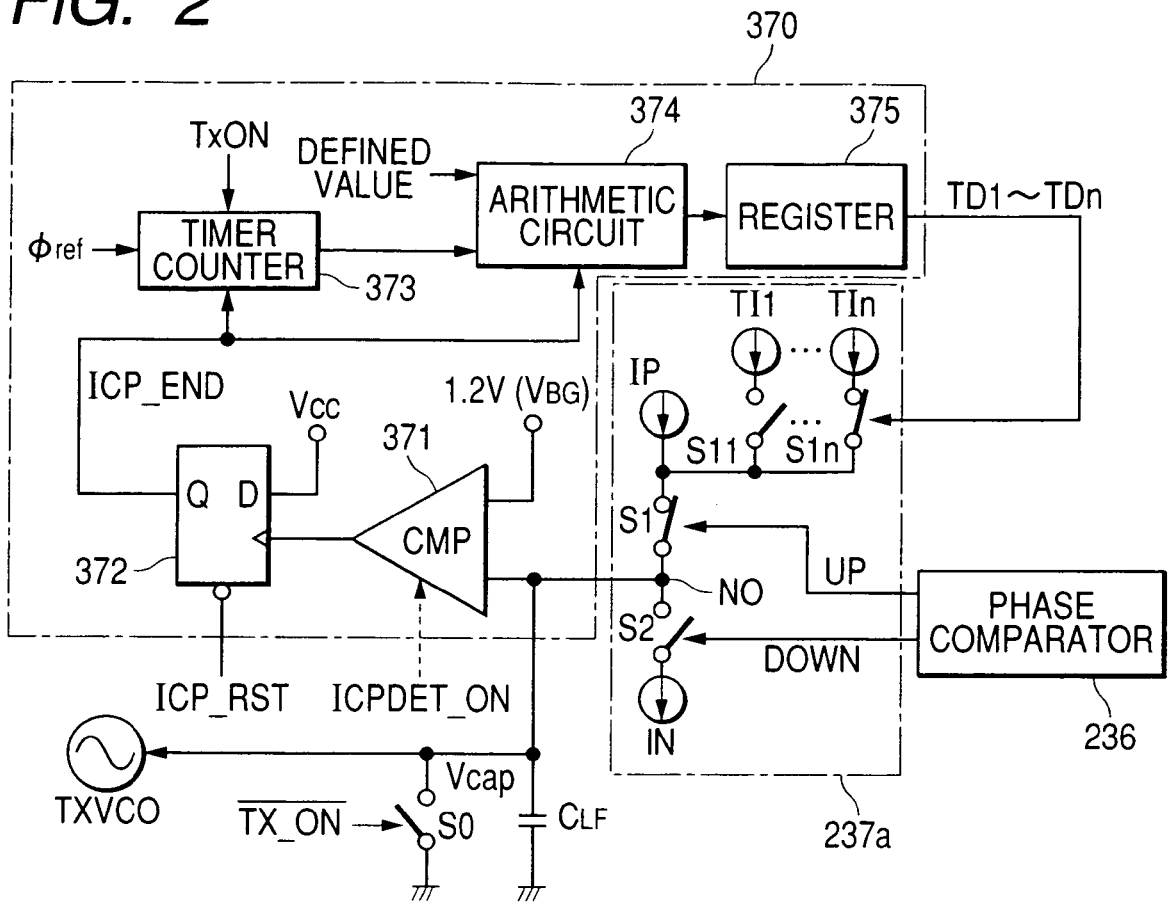
FIG. 2 is a block diagram showing one embodiment of a charge pump on a PLL loop including the TXVCO contained in the communication semiconductor integrated circuit (RF IC) shown in FIG. 1, and a current measurement correction circuit that measures a current of a current source of the charge pump and generates a current correction value.

The method of correcting the deviation of the current Icp of the charge pump of this embodiment will be described with FIG. 2. FIG. 2 shows the detail of a part of the charge pump 237a of the charge pump & loop filter 237 in FIG. 1.

The charge pump 237a includes a current source IP for charging up, a current source IN for charging down, switches S1, S2 connected between these current sources IP, IN and an output node N0, which are turned on or off by the up signal UP or the down signal DOWN from the phase comparator 236 during transmission, current sources T11~T1n for the current correction, which are placed in parallel to the current source IP, and calibration switches S11~S1n provided between these current sources T11~T1n and the switch S1 and so forth.

A capacitor CLF being a constituent of the loop filter is connected between the output node N0 of the charge pump 237a and the ground. The capacitor CLF is an externally mounted capacitor in this embodiment, which is not specifically restricted. When the loop filter is of the first order, it can be configured with the capacitor CLF and a wiring parasitic resistor and so forth. When the loop filter is of a higher order, higher than the second order, an additional capacitor and resistor have to be prepared. The capacitor and resistor except for the capacitor CLF may be placed before the phase comparator 236.

The charge pump 237 of this embodiment accompanies a current measurement correction circuit 370 capable of measuring the current value of the current source IP and correcting the current dispersion. The current measurement correction circuit 370 includes a comparator 371 that detects the potential at the output node N0 of the charge pump 237a, a D-type flip flop 372 that operates as a latch by the output of the comparator 371, a timer counter 373 that counts the reference clock φref to perform a timer operation, an arithmetic circuit 374 that calculates a correction value of the current Icp based on a counter value of the timer counter 373 and a defined value, and a register 375 that stores the correction value calculated and so forth. And the arithmetic circuit 374 supplies signals TD1~TDn for controlling the calibration switches S11~S1n inside the charge pump 237a, thereby correcting the deviation of the current value of the current source IP. Further, a reset switch S0 for discharging the charges of the capacitor CLF is provided between the output node N0 of the charge pump 237a and the ground.

Figure 3:
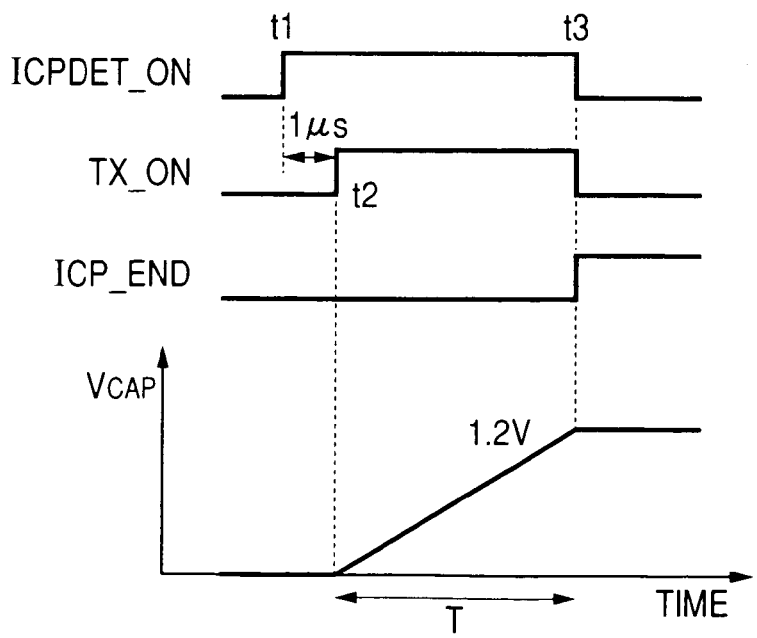
FIG. 3 is a timing chart showing the operation timing of the current measurement correction circuit shown in FIG. 2.

Next, the operation of measuring and correcting the current value of the current source IP of the charge pump 237 with be described with FIG. 3.

In measuring the current value, first, a measurement starting signal TX_ON is set to Low level, the switch S0 is turned on, the charges of the capacitor CLF are discharged, and in this condition, a signal ICPDEF_ON is brought to High level, thus activating the comparator 371 (timing t1). And the switch S1 is set to the on state, and the switch S2 and switches S11~S1n are set to the off state. And after 1 μsec, for example, the measurement starting signal TX_ON is turned to High level (timing t2). Then, the switch S0 is turned off, the capacitor CLF is charged by the current from the current source IP, and the potential Vcap at the output node N0 is increased gradually. Accompanied with this, the timer counter 373 starts the timer operation based on the clock φref.

When the current value of the current source IP is the value as set, the voltage that the potential Vcap at the output node N0 is to reach at a predetermined time after starting the charge is applied to the comparator 371 as a comparison voltage VBG. As the potential Vcap at the output node N0 reaches the comparison voltage VBG, the output of the comparator 371 varies to change the output of the flip flop 372 into High level (timing t3). Thereby, the timer counter 373 halts the timer operation. The arithmetic circuit 374 fetches the coefficient of the timer counter at that moment, compares it with the defined value provided in advance, thereby detects how far the current Icap of the current source IP deviates from the design value, and generates the control signals TD1~TDn according to the deviation detected.

Here, when the current value of the current source IP is the value as designed, it is given by Icp, and when the current value of the current source IP deviates from the design value, it is given by Icp'; and when the capacitor CLF is charged by Icp and the voltage Vcap reaches the comparison voltage VBG, the counter value of the counter 373 is given by CNT, and when the capacitor CLF is charged by Icp' and the voltage Vcap reaches the comparison voltage VBG, the counter value of the counter 373 is given by CNT'. On the above definitions, the ratio CNT'/CNT is assumed as the current correction coefficient A. Then in this embodiment, the arithmetic circuit 374 and the current sources T11~T1n for the current correction are configured to be capable of correcting the current Icp by 1% when A is '+1', and correcting the current Icp by 2% when A is '+2', . . . . Thereby, the control signals TD1~TDn to the switches S11~S1n inside the charge pump 237 can easily be generated from the current correction coefficient A.

The control signals TD1~TDn determine the on/off state of the switches S11~S1n, which determines the current sources T11~T1n for the current correction that are connected in parallel with the current source IP. The current sources T11~T1n for the current correction have smaller values than the current source IP, and use the values weighted by the n-th power of 2. Thereby, comparably few current sources perform the current correction with comparably large number of stages.

Figure 4:
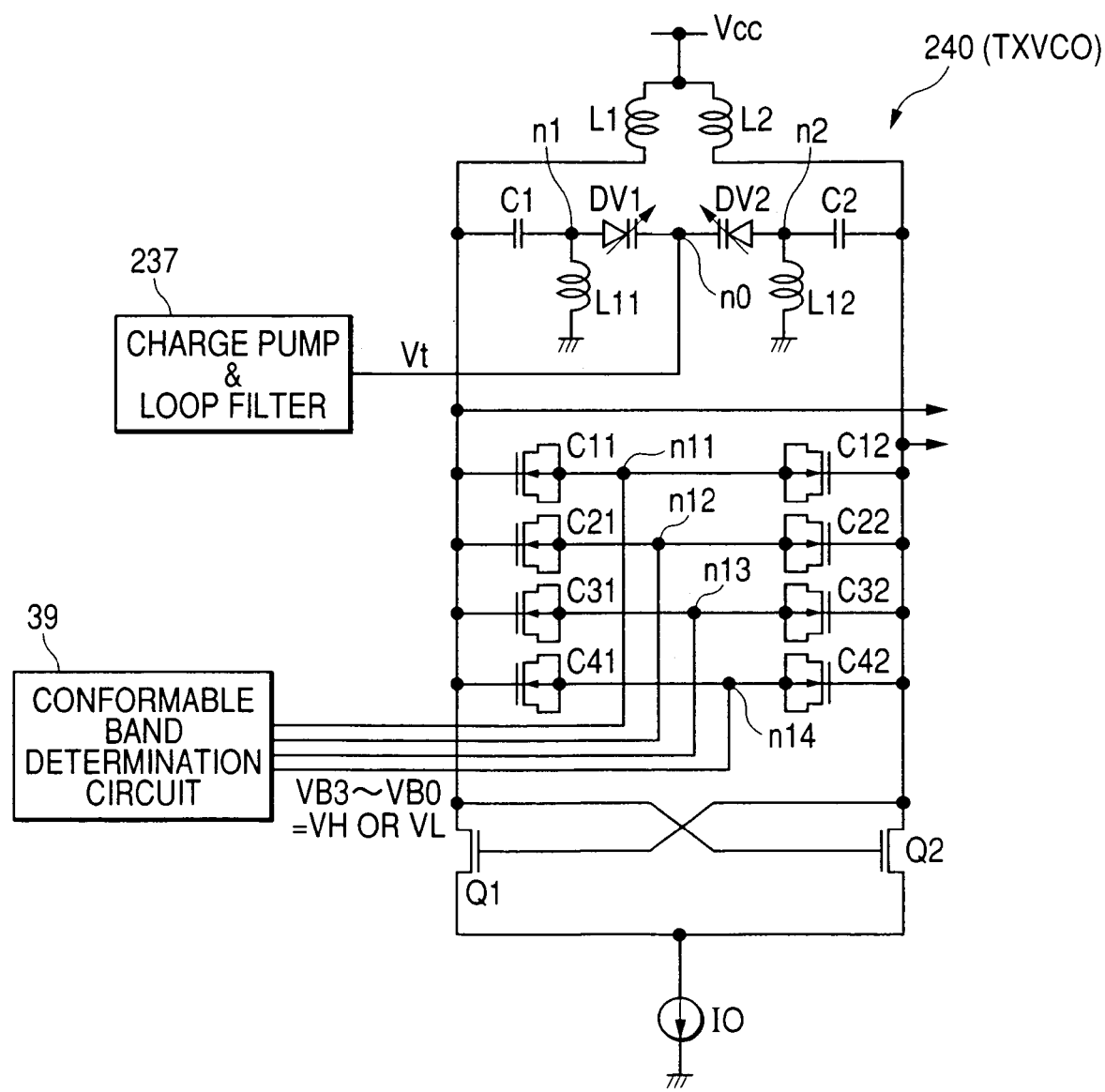
FIG. 4 is a circuit diagram showing a concrete example of the TXVCO.

FIG. 4 shows a circuit configuration of the transmission VCO used in this embodiment. The transmission VCO used in this embodiment is an LC resonant oscillator, and it includes a pair of N-channel MOS transistors Q1, Q2 whose sources are commonly connected, and whose gates and drains are cross connected, a constant current source I0 connected between the commonly connected sources of the transistors Q1, Q2 and the ground GND, inductors L1, L2 connected between each of the drains of the transistors Q1, Q2 and a power supply terminal Vcc, a capacitor C1, varactor diodes Dv1, Dv2 as a variable capacitor, and a capacitor C2 that are connected in series between the drain terminals of the transistors Q1, Q2, an inductor L11 connected between a connection node n1 of the capacitor C1 and the varactor diode Dv1 and the ground, an inductor L12 connected between a connection node n2 of the capacitor C2 and the varactor diode Dv2 and the ground, capacitors C11, C12 connected in series between the drain terminals of the transistors Q1, Q2, and capacitors C21, C22; C31, C32; C41, C42 that are connected in parallel to the capacitors C11, C12, and so forth.

And in the oscillator of this embodiment, the control voltage Vt from the charge pump & loop filter 237 is applied to a connection node n0 of the varactor diode Dv1 and the varactor diode Dv2, and the oscillator frequency is controlled to be continuously variable. On the other hand, the band selection signals VB3~VB0 are supplied from a conformable band determination circuit 19 to a connection node n11 of the capacitor C11 and the capacitor C12, a connection node n12 of the capacitor C21 and the capacitor C22, a connection node n13 of the capacitor C31 and the capacitor C32, and a connection node n14 of the capacitor C41 and the capacitor C42. Thus, the band selection signals VB3~VB0 are brought to either High level or Low level, thereby the oscillator frequency is controlled to be stepwise variable.

The capacitor C11 and the capacitor C12 have a same capacitance, and in the same manner, C21 and C22, C31 and C32, C41 and C42 each have a same capacitance. The capacitances of the capacitors C11, C21, C31, and C41 are set to each have the weighting of the m-th power of 2 (m: 3, 2, 1, 0), and the capacitances can be varied with 16 steps corresponding to the combinations of the band selection signals VB3~VB0. Therefore, the oscillator is controlled to operate on any of the frequency characteristics of 16 bands as shown in FIG. 5.

Figure 5:
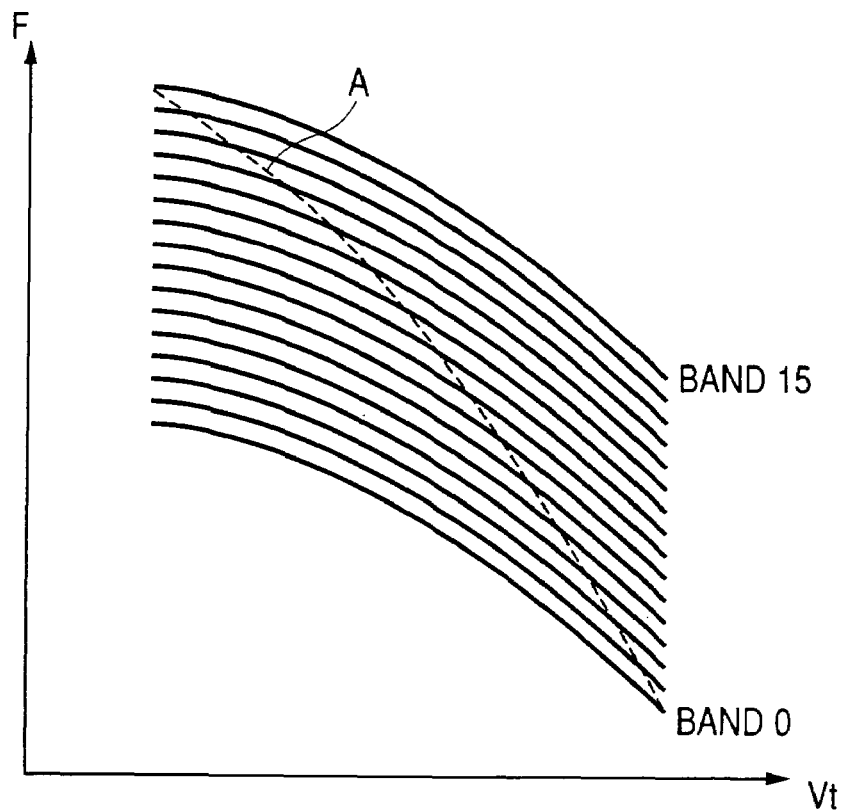
FIG. 5 is a characteristic chart showing the relation between the control voltage Vt and the oscillation frequency fTX in the TXVCO.

In a trial of widening the frequency range that the VCO has to cover, if the trial is made only with the capacitance variations of the varactor diodes Dv1, Dv2 by the control voltage Vt, the Vt-frF characteristic will become sharp, as shown by the dotted line A in FIG. 5, and the sensitivity of the VCO, namely, the ratio of the frequency variation against the control voltage variation ($\Delta f/\Delta Vt$) will be increased. Consequently, the VCO becomes susceptible to noises. That is, only a slight noise superposed on the control voltage Vc will greatly vary the oscillation frequency of the VCO.

To solve this problem, the transmission oscillators (TXVCO) 240a, 240b of this embodiment contain plural capacitors connected in parallel that constitute the LC resonant oscillator, switch the capacitors to be connected into 16 steps by the band selection signals VB3~VB0, and vary the capacitance C. Thus, the transmission oscillators (TXVCO) 240a, 240b are configured to perform the oscillation control according to the 16 Vt-ftF characteristic curves as shown by the solid lines in FIG. 5, and to select any one of the characteristics in correspondence with the usable frequency band during transmission.

Here, in the LC resonant oscillator of this embodiment, the capacitors C11~C42 are formed with capacitors between the gate electrodes of N-channel MOS transistors and the substrate. And, by appropriately setting the ratio of the gate widths of the MOS transistors forming the capacitors C11~C42, a desired capacitance ratio (m-th power of 2) can be attained. Hereunder, the capacitors C11~C42 are called band switching capacitors, and the varactor diodes Dv1 and Dv2 are called variable capacitors. Capacitors formed on a semiconductor substrate, having a sandwiched structure of metal film-insulating film-metal film, may be used for the capacitors C11~C42.

In this embodiment, on-chip devices are used for the inductors L1, L2, L11, and L12. This is to reduce the number of components, and naturally external elements can be used. The reason for adding the inductors L11, L12 other than the inductors L1, L2 is to reduce the dependence of the oscillation frequency upon the power supply voltage Vcc, and the inductors L11, L12 and the capacitors C1, C2 can be eliminated. In that case, the connection of the varactor diodes is inverted.

Next, the measurement of the frequencies of respective bands and the correction operation of the KV characteristic in the transmission VCO will be explained. The dispersion of the KV characteristic in the transmission VCO largely depends on the capacitance dispersions of the variable capacitors Dv1, Dv2 and the capacitance dispersions of the band switching capacitors C11~C42. First, the relation between the capacitance dispersions of the variable capacitors Dv1, Dv2 and the dispersion of the KV characteristic will be explained with FIG. 6 through FIG. 8.

Figure 6:
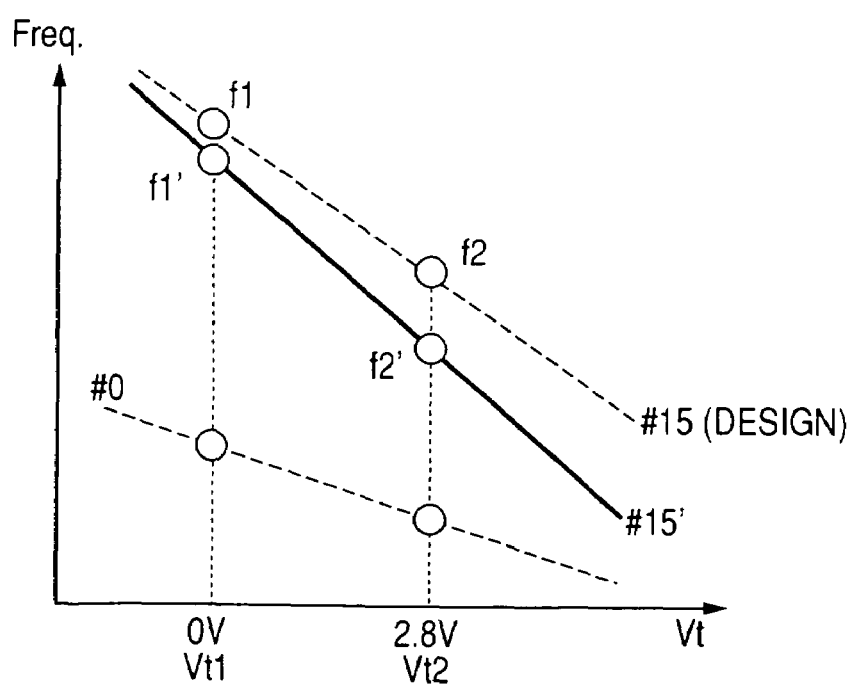
FIG. 6 is a characteristic chart in which a part of the control voltage vs. oscillation frequency characteristic in the TXVCO is expanded.

The frequency dispersion of the VCO dependent on the capacitance dispersions of the variable capacitors Dv1, Dv2 appears at the maximum, when the High level voltage is applied to the nodes n11~n14 to disappear all the band switching capacitors C11~C42. The frequency characteristic of the VCO in this case is the band #15 out of the bands #0~#15 as shown in FIG. 5. FIG. 6 shows the characteristic of the band #15, which is expanded. In FIG. 6, the dotted lines show the characteristic when there are not any capacitance dispersions in the variable capacitors Dv1, Dv2, and the solid line shows an example of the characteristic when the variable capacitors Dv1, Dv2 deviate from the design value.

Figure 7:
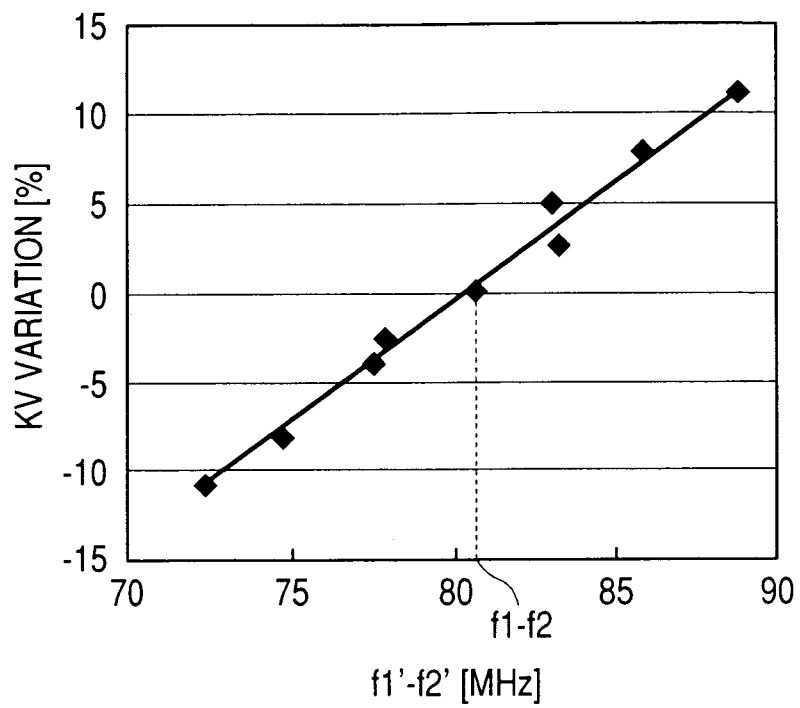
FIG. 7 is a characteristic chart showing the relation between the oscillation frequency difference and the KV variation at two points in the same band, in the TXVCO for the GSM.
Figure 8:
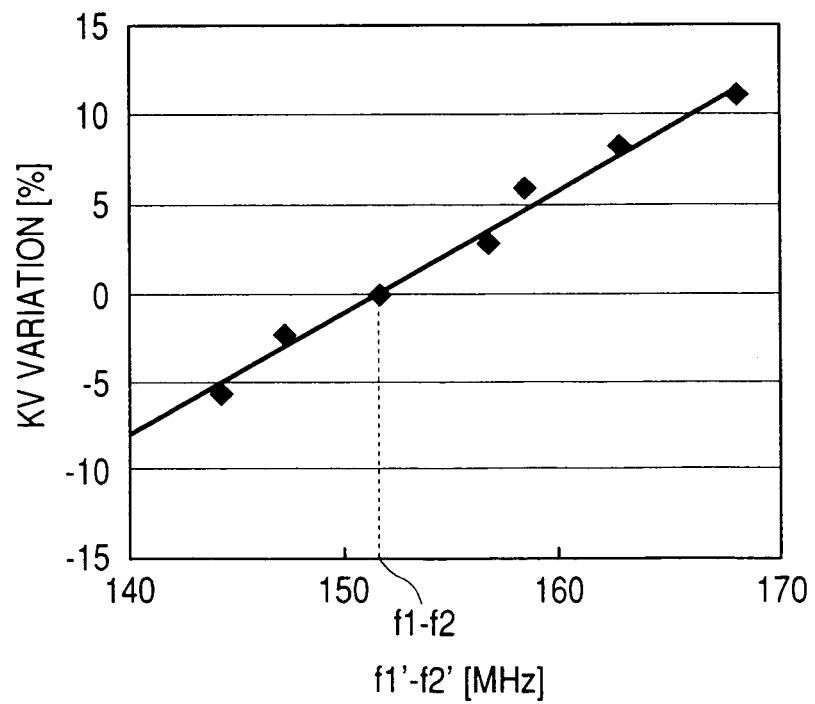
FIG. 8 is a characteristic chart showing the relation between the oscillation frequency difference and the KV variation at two points in the same band, in the TXVCO for the DCS/PCS.

FIG. 7 shows the relation of the KV variation against the frequency difference (f1'-f2') of the oscillation frequencies f1', f2' corresponding to the two control voltages Vt1 (0 V), Vt2 (Vcc) of the transmission VCO 240a for the GSM of the transmission oscillators (TXVCO) 240a, 240b, based on a simulation result. FIG. 8 shows the relation of the KV variation against the frequency difference (f1'-f2') of the oscillation frequencies f1', f2' of the transmission VCO 240b for the DCS and PCS, based on a simulation result. Here, the KV variation is given by Kv'/Kv, in which Kv is the KV value when there are not any capacitance dispersions in the variable capacitors Dv1, Dv2, namely, the design value, and Kv' is the KV value of the actual VCO. FIG. 7 and FIG. 8 confirm that the KV variation is proportional to the frequency difference f1'-f2' (hereunder, written as $\Delta f'$) of the oscillation frequencies f1', f2' in the transmission VCO as shown in FIG. 4.

In this embodiment, the measurement was made as to the oscillation frequency f1' of the band #15 of the VCO when 0 V is applied as the control voltage Vt to the node n0 on the cathodes of the varactor diodes Dv1, Dv2, and the oscillation frequency f2' of the band #15 when 2.8 V is applied as the control voltage Vt. And, the determination was made as to a variation of the KV value from the difference Δf' of the two frequencies, and further a capacitance correction coefficient B for correcting the current value Icp' of the current source IP of the charge pump, which is necessary for correcting the above variation of the KV value.

In concrete, the current value Icp' of the current source IP of the charge pump is calibrated to satisfy Kv·Icp=Kv'·Icp'. From this equation, Icp'=Icp·(Kv/Kv') is calculated. As mentioned above, the frequency difference Δf' is proportional to the KV variation (Kv'/Kv), namely, Δf' is unproportional to Kv/Kv'. Therefore, the above equation is expressed by Icp'=Icp·{B/Δf'}, using the frequency difference Δf'.

This confirms that if the frequencies f1', f2' of the transmission oscillator (TXVCO) 240 when the control voltage Vt is set to Vt1 (0 V) and Vt2 (Vcc) are detected by measurement, Icp' can be calibrated to satisfy Kv·Icp=Kv'·Icp'. Besides, in the RF IC 200 of this embodiment, the current of the charge pump is controlled so as to be capable of correcting the current Icp by 1% when the capacitance correction coefficient B is '+1', and correcting the current Icp by 2% when the capacitance correction coefficient B is '+2', . . . . Thereby, the control signals TD1~TDn to the switches S11~S1n inside the charge pump 237 can easily be generated from the capacitance correction coefficient B. Here, in this embodiment, Vcc is specified as 2.8 V, but it is not limited to this.

Further, the RF IC 200 of this embodiment provides the PLL circuit of the oscillator IFVCO 230 for determining the usable band in the IFVCO configured in multi-bands with a function to measure the frequency, which is the same as in the TXVCO. The frequencies f1', f2' of the TXVCO are measured by means of this function, and the usable band in the TXVCO is determined. Also, the deviation of the KV characteristic of the TXVCO accompanied with the capacitance dispersions of the varactor diodes Dv1, Dv2 can be corrected by means of the measured values attained by that frequency measurement. The measurement of the frequency in the IFVCO and TXVCO will be explained afresh later.

The above KV correction is related to the KV characteristic of the highest frequency band #15 among the KV characteristics of 16 bands that the TXVCO possesses, as shown in FIG. 5. The KV characteristics of the other bands #0~#14 are determined by the connection conditions of the band switching capacitors C11~C42, as already mentioned. And if there are any dispersions in the band switching capacitors C11~C42, it will produce a deviation on the control voltage vs. oscillation frequency characteristic. Next, the method of correcting the dispersion of the KV characteristic due to the capacitance dispersions of the band switching capacitors C11~C42 inside the TXVCO will be explained. Since the band switching capacitors C11~C42 are formed on one and the same semiconductor chip, if any one capacitance disperses, the other capacitances will disperse at the same rate.

Figure 9A:
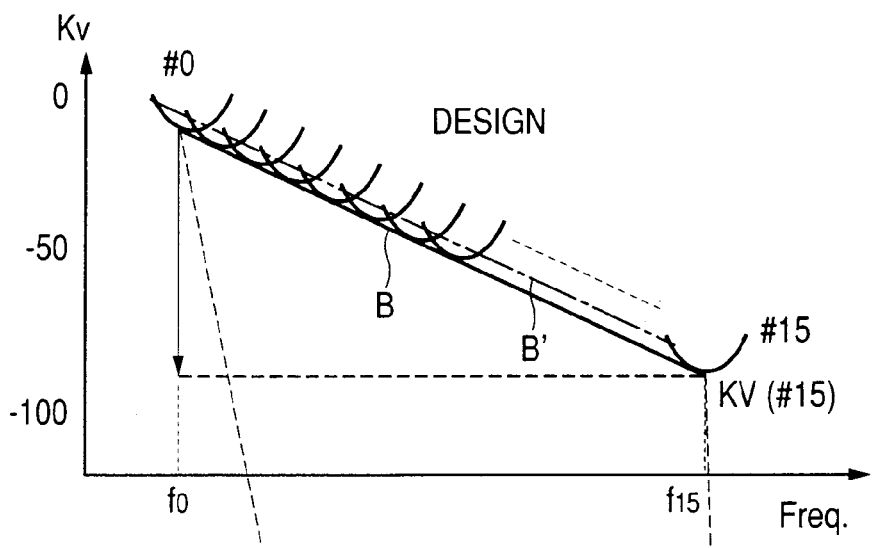
FIG. 9 is a characteristic chart showing the relation of the KV characteristic of each band #0 ~#15 of the TXVCO.
Figure 9B:
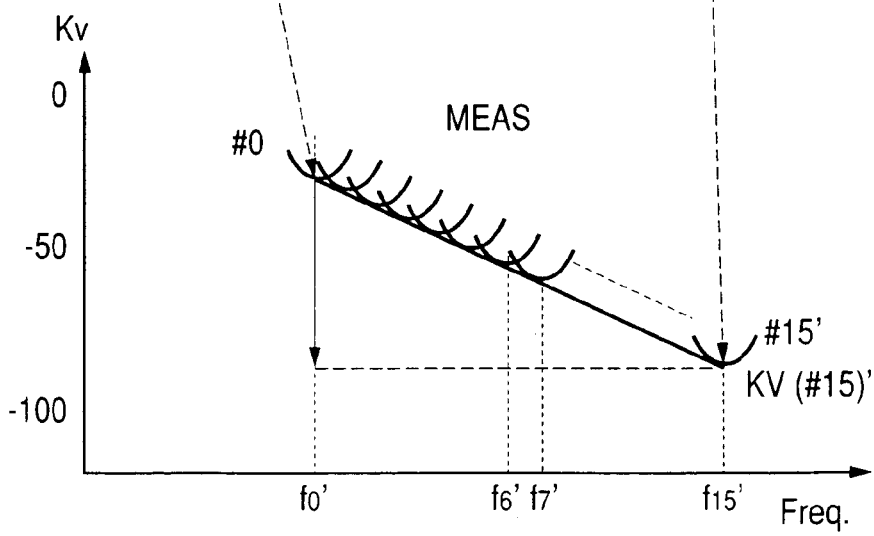

FIG. 9 shows the KV characteristic curves of each band #0~#15. And FIG. 9A shows the KV characteristic curves when the band switching capacitors C11~C42 are formed as the capacitances thereof are equal to the design values, and FIG. 9B shows the KV characteristic curves when the capacitances of the band switching capacitors C11~C42 deviate toward smaller values from the design values. In this embodiment, when the KV value of the band #15 is given by Kv(#15), and the KV value of the band #0 is given by Kv(#0), the ratio Kv(#15)/Kv(#0) is designed to become 1.55 in the TXVCO 240a for the GSM, and it is designed to become 1.30 in the TXVCO 240b for the DCS and PCS, which is not specifically restricted.

As it is clear from the comparison of FIG. 9A and FIG. 9B, when the capacitances of the band switching capacitors C11~C42 deviate toward smaller values against the design values, the whole distribution of the characteristic curves is proportionally shrunk to the direction that the ratio Kv(#15)/Kv(#0) becomes smaller than 1.55 or 1.3. Although not illustrated, when the capacitances of the band switching capacitors C11~C42 deviate toward larger values against the design values, the whole distribution of the characteristic curves is proportionally expanded to the direction that the ratio Kv(#15)/Kv(#0) becomes larger than 1.55 or 1.3.

Here, the KV value Kv(#15)' of the band #15 in FIG. 9B (in the state of all the band switching capacitors C11~C42 being off) deviates from the KV value Kv(#15) of the band #15 in FIG. 9A. This comes from that the KV characteristic curves in FIG. 9 were shown to include the capacitance dispersions of the variable capacitors Dv1, Dv2. If the deviation of the KV value accompanied with the capacitance dispersions of the variable capacitors Dv1, Dv2 is corrected by the above correction method, the KV value Kv(#15)' of the band #15 will coincide with the Kv(#15) of the design value. Therefore, the KV characteristic distribution of the TXVCO after the above correction is found to become almost proportional to the KV characteristic distribution of the idealistic TXVCO.

The bottoms of the parabolas showing the KV characteristics (the minimum values of the KV) of each band sit side by side on a straight line, as shown in FIG. 9. And, the KV value Kv(#15) of the band #15 of the design value and the KV value Kv(#0) of the band #0 can be known in advance by calculation. Therefore, if the frequency f15' of the band #15 and the frequency f0' of the band #0 are measured in the actual VCO, the KV value Kv(#15) of the band #15 can be obtained by calculation. And, with regard to any two bands other than the band #15 and the band #0, for example, the band #6 and the band #7, (f0-f15):(f6-f7)=(f0'-f15'):(f6'-f7') is satisfied.

Therefore, the deviation of the KV value can be calculated by means of measuring the frequencies of arbitrary two bands other than the band #15 and the band #0, whereby the correction value of the current Icp of the current source of the charge pump can be determined. In the above explanation, the frequencies of each band are defined as the frequencies at the bottom positions of the KV characteristic carves; however, since the KV characteristic curves of each band are virtually the same, the intersections of a line B' made by the parallel displacement of a virtual line B in FIG. 9A and the KV characteristic curves of each band sit on the same positions of the characteristic curves. Therefore, if the frequencies corresponding to the intersections of the line B' and the KV characteristic curves of each band, namely, the control voltages Vt are the same, the correction value can be determined by using the frequency measurement value of each band at an arbitrary control voltage (for example, 1.0 V).

Further, if the correction value is determined on the basis of the frequencies f6', f7' of the TXVCO that are measured without correcting the capacitance dispersions of the variable capacitors Dv1, Dv2, the determined correction value is totalized with a correction value that is determined to correct the KV value due to the capacitance dispersions of the variable capacitors Dv1, Dv2, and the totalized value is used as a new correction value, it will be possible to correct the deviation of the KV value due to the capacitance dispersions of the variable capacitors Dv1, Dv2, and the deviation of the KV value due to the capacitance dispersions of the band switching capacitors C11~C42 at the same time. In that case, it is possible to store the correction value after totalized in the register 37, to read out the correction value corresponding to a value by which a conformable band is determined, and to supply it to the charge pump. Concretely, it is preferred to calculate the correction values corresponding to the frequency measurement values of each band stored in the register 37, and to store the values in the register 37 as a table-format data.

It is the same with the dispersion of the current Icp of the current source of the charge pump; and provided that the charge pump is operated with the current including the dispersion, and to (or from) the correction value of the KV value attained from the measured frequency is added (or subtracted) a correction value that is determined through detecting the dispersion of the current Icp of the current source of the charge pump, and the value after the above addition (including the subtraction) is used as a new correction value, it is possible to correct the deviation of the KV value due to the dispersion of the current Icp of the current source of the charge pump, the deviation of the KV value due to the capacitance dispersions of the variable capacitors Dv1, Dv2, and the deviation of the KV value due to the capacitance dispersions of the band switching capacitors C11~C42 at the same time. Also in this case, it is possible to store the correction value after totalized in the register 37.

And, also in case of correcting the deviation of the KV value due to the capacitance dispersions of the band switching capacitors C11~C42 by the abovementioned calibration of the current Icp of the current source of the charge pump, it will be convenient if the count value '1' of the correction value is correspondent to 1% of the current Icp. Accordingly, in determining the correction value from the frequency difference, this embodiment intended to find out any two bands in which the frequency difference is correspondent to 1% of the current Icp, and to use the frequency measurement values of the two bands and determine the correction value of the KV value. Further, the PLL circuit of the IFVCO in the RF IC 200 is provided with the counter function that measures the frequency in order to determine the usable band, accordingly this embodiment intended to measure the frequency of the IFVCO and the frequency of the TXVCO by using this counter function to determine the usable band, and to select a usable value in determining the correction value of the KV value among the measured frequency values in the TXVCO.

Figure 10:
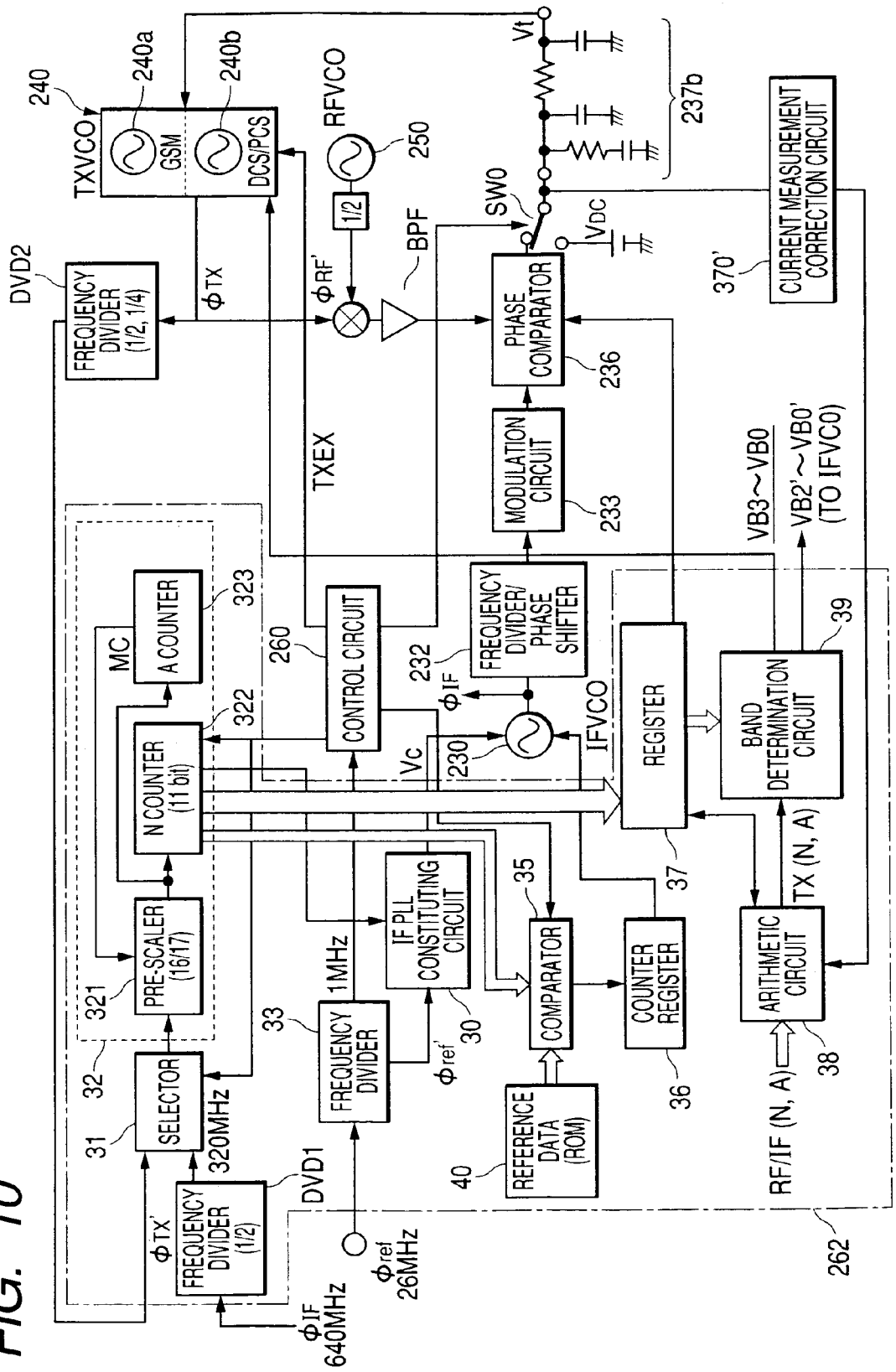
FIG. 10 is a block diagram showing one embodiment of a PLL circuit including the IFVCO contained in the communication semiconductor integrated circuit (RF IC) shown in FIG. 1, and a PLL circuit including the TXVCO contained in the same.

Next, the circuit to calibrate the frequency measurement value of the TXVCO and the KV value will be explained in detail. FIG. 10 shows a concrete example of the PLL circuit, which is provided with the function to measure the frequency of the TXVCO and the function to select the usable band on the basis of the measurement result. Here, in FIG. 10, the same circuits and devices as those shown in FIG. 1 are given the same symbols to eliminate repeated explanations.

In the embodiment shown in FIG. 10, a current measurement correction circuit 370' is the circuit in which the arithmetic circuit 374 and the register 375 are eliminated from the current measurement correction circuit 370 shown in FIG. 2. The function of the arithmetic circuit 374 and the register 375 is contained in an arithmetic circuit 38 and a register 37 for determining the usable band, described later. And in FIG. 10, the circuit equivalent to the charge pump 237 is not illustrated. This is because the output stage of the phase comparator 237 can be configured as the circuit that possesses the same function as the charge pump.

On the other hand, FIG. 10 shows the circuit configuration of a loop filter 237b. The resistors and capacitors configuring the loop filter 237b are connected as externally mounted elements. Further in the embodiment of FIG. 10, during the frequency measurement of the TXVCO 240a, 240b, and the drawing-in of the PLL circuit, a predetermined dc voltage VDC from a dc power supply 217 is supplied to the loop filter 238 by a switch SW0', instead of the voltage Vt from the charge pump.

The PLL circuit shown in FIG. 10 is a concrete example of the IF synthesizer 262 shown in FIG. 1. In this embodiment, the PLL circuit is configured to be capable of measuring the frequency of the oscillator (IFVCO) 230 that generates the oscillation signal φIF of the intermediate frequency by using the IF synthesizer 262 as well as the frequency of the transmission oscillators (TXVCO) 240a, 240b. With regard to the TXVCO 240a for the. GSM and the TXVCO 240b for the DCS and PCS, either one of them is made into operation by the control signal from the control circuit 260, during the frequency measurement and transmission.

The IF synthesizer 262 includes a frequency divider DVD1 that divides the frequency of the oscillation signal φIF of the IFVCO 230 into ½, a selector 31 that selects the signal divided by the frequency divider DVD1 or an output signal from a frequency divider DVD2 that divides the frequency of the oscillation signal φTX of the TXVCO 240a (240b) into ½ or ¼, a variable frequency divider 32 that divides a selected signal frequency, a fixed frequency divider 33 that divides the frequency 26 MHz of the reference oscillation signal φref from the reference oscillator (VCXO) 264 into 1 MHz, and an IF PLL circuit 30 and so forth.

The detail of the IF PLL circuit 30 is not illustrated in the drawing, but it includes a phase comparator, a charge pump, and a loop filter and so forth, in the same manner as the transmission PLL circuit. The variable frequency divider 32 includes a pre-scaler 321 capable of 1/16 frequency division or 1/17 frequency division, an N counter 322, and an A counter 323, in which the latter two constitute a modulo-n counter.

Further, the IF synthesizer 262 includes a comparator 35 that compares a value counted by the N counter 322 during the frequency measurement of the VCO and the reference data (frequency information) stored in an ROM 40, a counter register 36 that holds the usable band information of the IFVCO 230 based on the comparison result of the comparator 35, a register 37 that stores a value counted by the N counter 322 during the frequency measurement of the IFVCO and TXVCO, the arithmetic circuit 38 that calculates target oscillation frequency values TX (N, A) of the IFVCO and TXVCO on the basis of frequency set values RF/IF (N, A) of the RFVCO and IFVCO being supplied from the base band circuit, and a conformable band determination circuit 39 that compares a calculated value by the arithmetic circuit 38 and a value stored in the register 37 to generate codes VB2'~VB0', VB3~VB0 for designating the usable band in the IFVCO and TXVCO. Here, the conformable band determination circuit 39 can be configured as a part of the control circuit 260. The arithmetic circuit 38 can be made into a common circuit to the arithmetic circuit 374 shown in FIG. 2, and the register 37 can be made into a common circuit to the register 375 shown in FIG. 2.

During the frequency measurement, the dc voltage VDC supplied to the loop filter 16 by the switch SW0 may be any value if it is within the effective variable range of the control voltage Vc. In this embodiment, an intermediate voltage in the variable range of the control voltage Vt, for example, 1.0 V is selected as the dc voltage VDC. Naturally, the dc voltage VDC is not limited to 1.0 V, and an arbitrary voltage such as 1.2 V or 1.4 V can be taken, if it is within the variable range of the control voltage Vt. During the frequency measurement, the dc voltage VDC is designed to take one and the same value even if the band is switched. The control circuit 260 controls the switch SW0, variable frequency divider 32, comparator 35, register 37, arithmetic circuit 38, and conformable band determination circuit 39.

The IFVCO 230 is configured with an LC resonant oscillator similar to the TXVCO shown in FIG. 4, and plural capacitors constituting the LC resonant oscillator are arrayed in parallel. The capacitors are selectively connected by the band switching signals VB1~VB0 to thereby switch the capacitance C of the LC resonant oscillator, so that the oscillation frequency can be switched into four steps. In this embodiment, the IF synthesizer 262 contains the register 37 and the conformable band determination circuit 39, which saves the calibration work called the frequency adjusting being performed in the conventional PLL circuit.

That is, in the conventional PLL circuit, while operating the VCO and measuring the frequency, the frequency adjusting work has been carried out so as to make the control voltage vs. frequency characteristic (Vt-fIF characteristic) have a predetermined initial value and a predetermined slope. On the other hand, in the PLL circuit of this embodiment, the switch SW0 is switched in advance to apply a predetermined dc voltage VDC to the IFVCO 230, and the frequencies of each band are measured to store the data in the register 37. In the actual use, the set value corresponding to a specified band that is given to the N counter 322 and A counter 323 from the outside is compared with the measurement values stored in the register 37, the one that can cover the frequency range of the specified band is selected among the plural (eight) Vt-fIF characteristic curves, and the switching of the IFVCO 230 (switching of the capacitors) is carried out so as to perform the oscillation control operation according to the characteristic curve.

According to this method, provided that the IFVCO is designed to cover the frequency range slightly wider than the desirable range in consideration for the dispersions, and to overlap the frequency range little by little (preferably, half-and-half) by the adjacent two of the eight-step Vt-flF characteristic curves, there is always a characteristic curve that covers the specified frequency range. Therefore, it is only needed to select the Vt-fIF characteristic curve corresponding to the specified band, on the basis of the actual characteristics attained by the measurement. Thereby, the frequency adjusting becomes unnecessary, and it is not needed to set in advance the usable band and the switching state of the IFVCO in one-to-one correspondence. This is the same with the TXVCO 240a, 240b.

The method of dividing the frequency of the oscillation signal by the modulo-n counter composed of the pre-scaler 321, N counter 322, and A counter 323 is already a well-known technique. The pre-scaler 321 is configured to be capable of dividing the frequency with two different frequency-dividing ratios, such as 1/16 and 1/17, and the count ending signal of the N counter 322 switches one frequency-dividing ratio into the other one. The N counter 322 and A counter 323 are a programmable counter. The N counter 322 receives the integral parts of the quotients acquired when a desired frequency (the oscillation frequency fIF of the VCO to be desirably acquired as the output) is divided by the frequency fref of the reference oscillation signal φref and the first frequency-dividing ratio (17, in this embodiment), as the set value; and the A counter 323 receives the residues (MOD) thereof as the set value. The counters terminate the counting operations when counting out the set values, and count again the set values.

As the pre-scaler 321 and the modulo-n counter are put in operation according to such a procedure, first the pre-scaler 321 divides the frequency of the oscillation signal of the IFVCO into 1/(2·16), and the A counter 323 counts the output until the set value. When terminating the counting, the A counter 323 outputs the count ending signal MC, and this signal MC switches the operation of the pre-scaler 21. Until the A counter 323 counts the set value, the pre-scaler 321 divides the frequency of the oscillation signal of the RFVCO 250 into 1/(2·17). By repeating such operations, the modulo-n counter 2 becomes able to divide the frequency of the oscillation signal not by the integral ratio, but by the ratio having a decimal part.

Further, this embodiment is configured to switch the selector 31 and input the oscillation signal from the TXVCO 240a or 240b to the pre-scaler 321; and the N counter 322 is configured to be able to operate as an 11-bits counter during the frequency measurement of the TXVCO. Thereby, the TXVCO 240a and 240b are configured to be able to switch the oscillation frequency into 16 bands, namely, 16 steps. The frequency is measured as to 15 bands (#0~#14) among 16 bands. The measured frequencies in each band (#0~#14) are stored in the register 37. In other words, in case the TXVCO has 16 switching bands, the counter is only needed to measure the calibration values of 15 bands. When the usable frequency band during the transmission does not conform to the bands #0~#14, the band #15 is automatically selected.

The control circuit 260 generates, during the frequency measurement of the IFVCO, the switching signals VB2'~VB0' to sequentially select 8 bands, and outputs them to the IFVCO 230. And the control circuit 260 generates, during the frequency measurement of the TXVCO, the switching signals VB3~VB0 to sequentially select 16 bands, and outputs them to the TXVCO 240a, 240b. Further, when the power supply is turned on, the control circuit 260 puts the current measurement correction circuit 370 in operation. And the control circuit 260 controls the circuit 370 to measure the current of the current source of the charge pump 237a, to detect the dispersion of the current, to determine the current correction value, and controls the register 37 to store the current correction value.

During the transmission, the conformable band determination circuit 39 compares the measurement values stored in the register 37 and the set codes IF (N, A) of the N counter 322 and the A counter 323 supplied to the arithmetic circuit 38, generates 3-bits codes VB2'~VB0', and outputs them to the IFVCO 230 as the band switching signal. And the conformable band determination circuit 39 compares the value calculated by the arithmetic circuit 38 on the basis of the set codes RF (N, A) and IF (N, A) and the value stored in the register 37, generates 4-bits codes VB3~VB0, and outputs them to the TXVCO 240a, 240b as the band switching signal. Since the RF IF 200 contains the arithmetic circuit 38, the base band circuit 300 need not supply the frequency set values of the IFVCO and TXVCO, and the determination of the usable bands of the IFVCO and TXVCO becomes possible in a shorter time.

And during the transmission, the control circuit 260 sends the frequency set value for selecting the band of the TXVCO stored in the register 37 to the arithmetic circuit 38, controls the arithmetic circuit 38 to calculate the deviation of the KV value on the basis of the frequency set value, determines the current correction value of the current source of the charge pump 237a, which is necessary for correcting the deviation, sends it to the charge pump 237a, and corrects the current. Here, the current correction value sent to the charge pump 237a in this case is the total of the correction value for correcting the deviation of the KV value due to the capacitance dispersions of the variable capacitors Dv1, Dv2, and the correction value for correcting the deviation of the KV value due to the capacitance dispersions of the band switching capacitors C11~C42. Thus, the arithmetic circuit 38 may totalize the correction values in real time; or it can totalize when the frequency measurement value is obtained, and store the correction value after totalized in the register 37.

Figure 11:
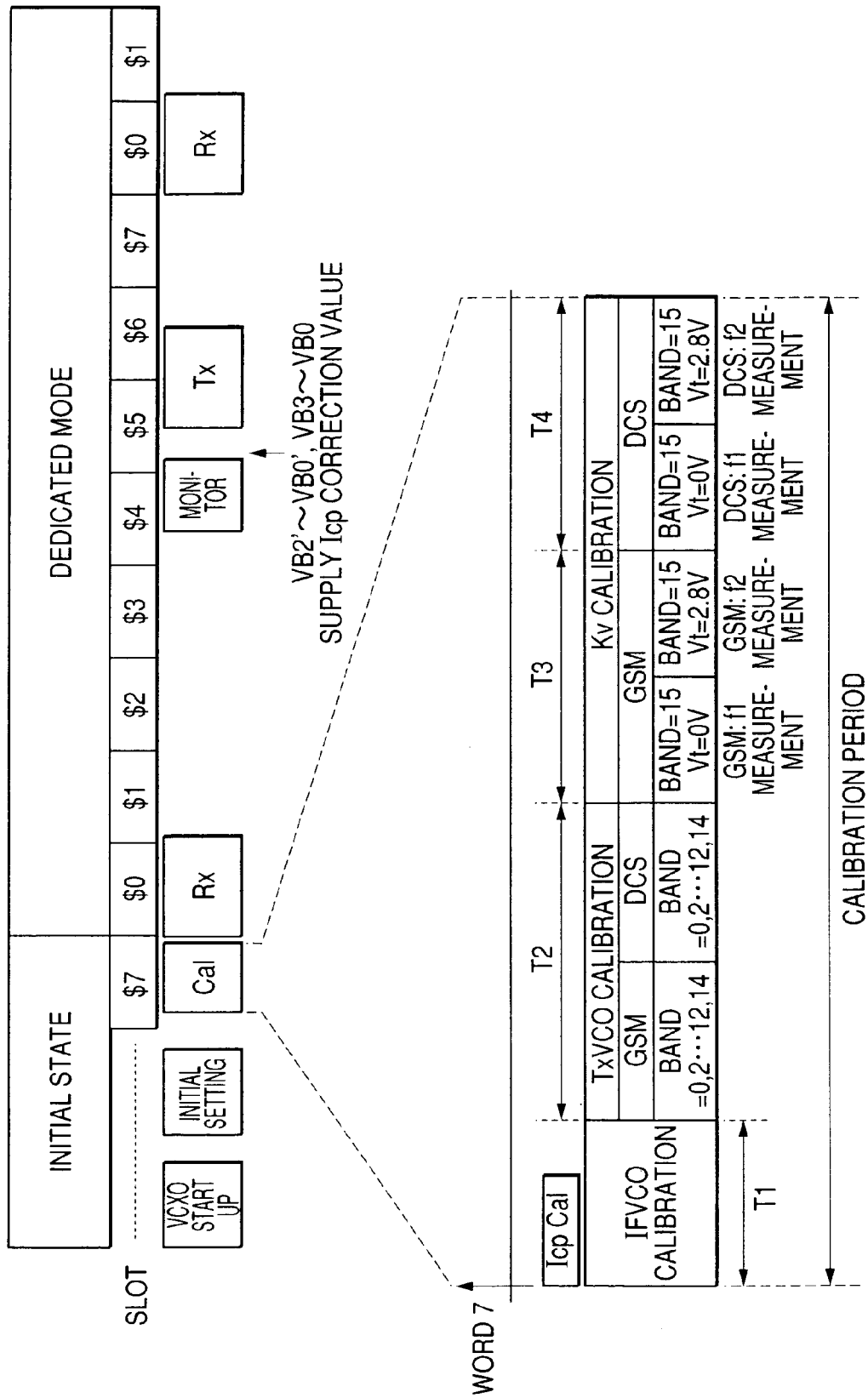
FIG. 11 is a timing chart showing the timing of the determination of a usable band and the correction of a current value, based on the frequency measurements of each VCO and the measured results thereof, in the radio communication system using the RF IC relating to the one embodiment of the invention.
Figure 12:
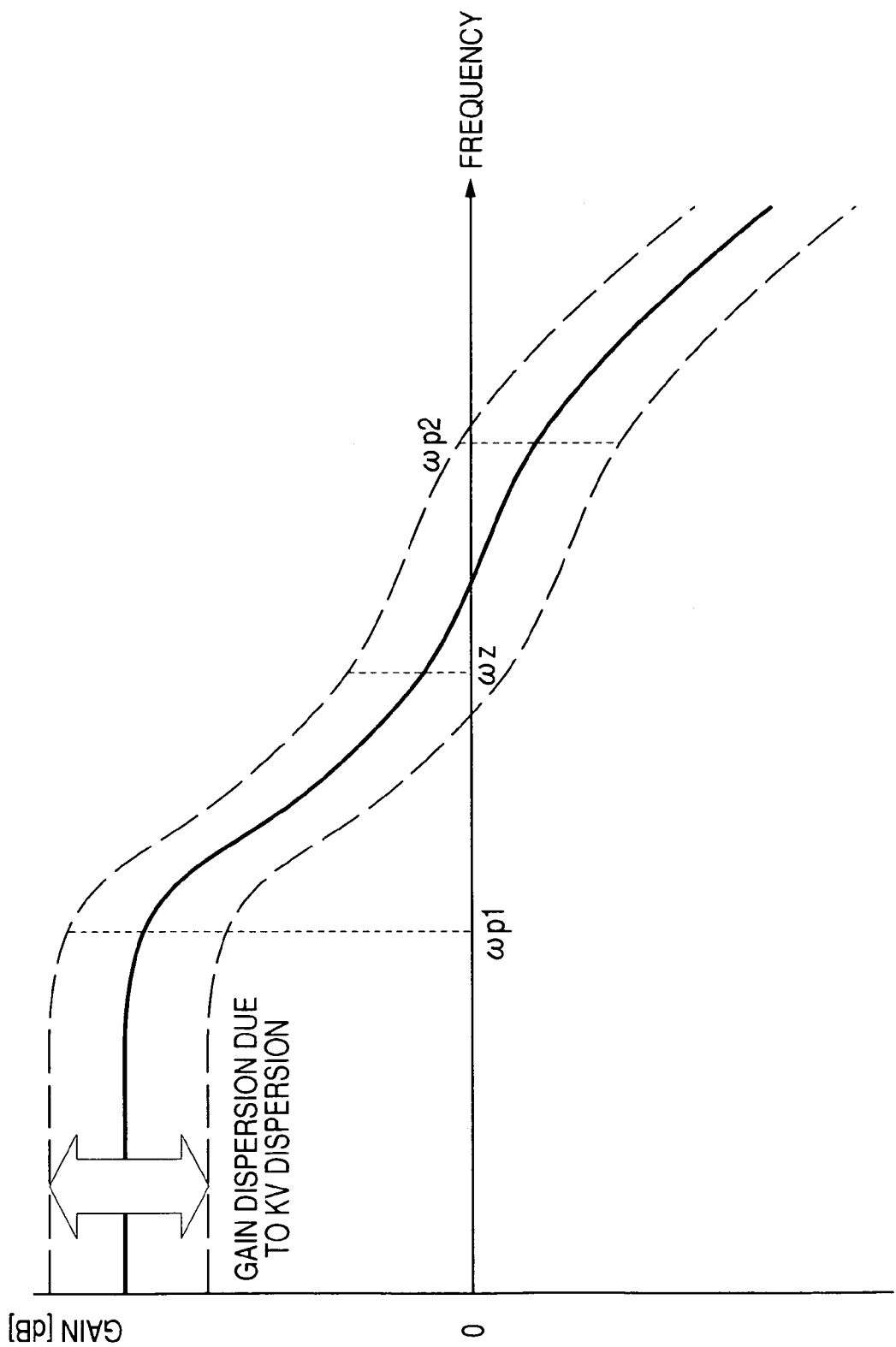
FIG. 12 is a loop gain frequency characteristic chart of the phase control loop in the polar loop system.

Next, the procedure of the frequency measurement of the IFVCO and TXVCO and the procedure of the correction of the KV value of the TXVCO in the radio communication system using the RF IC of this embodiment will be explained with reference to FIG. 11. In FIG. 11, "Initial State" signifies the state after the power supply rises until the transmission/reception becomes possible. "Dedicated Mode" signifies one frame period of the state being possible of the transmission/reception after "Initial State". Each frame is composed of eight slots. The reception mode "Rx" is allocated to the first slot $0, and the transmission mode "Tx" is allocated to the seventh slot $6. "Moni" allocated to the fifth slot $4 signifies the mode that measures the distance from the base station while using a constant reception state as the reference, and executes the measurement for determining the gain of the high gain amplifier during the reception. These modes are initiated by the command that the base band circuit 300 supplies to the control circuit 260 of the RF IC 200. The command is configured with a code (called Word) having a predetermined bit length, and plural types of command codes are prepared in advance.

The frequency measurement of the IFVCO and the frequency measurement of the TXVCO in the above embodiment are executed when a predetermined command (Word 7) is inputted from the base band circuit 300 during the idle mode, such as the time slot "$7" in the "Initial State" being the time slot for the GSM shown in FIG. 11, or the slot $0~$3 and $7 in the "Dedicated Mode" in which both the transmission and the reception are not executed. On the other hand, the selection of the band based on the frequency measurement result and the correction of the KV value are executed at the start of the transmission mode "TX". And In FIG. 11, "Rx" signifies the period while the reception burst appears after the reception mode command is transmitted.

After the power supply is on, when the base band circuit 300 supplies the RF IC 200 with the command named as "System Reset Word", the radio communication system comes into the "Initial State". Then, the control circuit 260 first starts the reference oscillator (VCXO) 264, and initializes the circuits such as the registers inside the RF IC 200. Thereafter, as the command (Word 7) is inputted, the measurement of the current Icp of the current source of the charge pump and the frequency measurement of the IFVCO and TXVCO are executed.

When the frequency measurement is competed, the base band circuit 300 supplies the RF IC 200 with "Synthesizer Control Word" including the value (frequency information of usable channels) set to the counter 322. Then, the control circuit 260 selects the usable band of the RFVCO 250 and sets the frequency value to the counter 322, on the basis of the frequency information from the base band circuit 300 and the frequency measurement result stored in the register 37. And the control circuit 260 puts the RFVCO 250 into the oscillation operation, and brings the PLL loop for reception into the lock-in state.

The "Synthesizer Control Word" includes a single control byte [TR] used for notifying the RF IC as to whether the next active slot is the transmission slot or the reception slot. As the reception mode is selected, even if the "Synthesizer Control Word" is sent to the RF IC, the IFVCO and the IF synthesizer are not activated. The base band circuit 300 sends the command to designate the transmission mode, and then it can send "Receive Word"; and when the RF IC receives the "Synthesizer Control Word", the IFVCO and the IF synthesizer are activated, and the oscillation frequency is locked in a correct frequency to start the reception slot. And, when the "Receive Word" is sent to the RF IC, the IFVCO and the IF synthesizer are automatically deactivated. On the other hand, as the transmission mode is demanded, to send the "Synthesizer Control Word" to the RF IC will activate the IFVCO and the IF synthesizer. The PLL loop including the IFVCO is locked before the transmission slot.

When the RF IC 200 receives "Receiver Control Word" to demand the reception operation from the base band circuit 300, the control circuit 260 starts the offset cancel circuits inside the high gain amplifiers 220A, 220B, to execute the input DC offset canceling of the amplifiers. After the DC offset canceling, the control circuit 260 enters the reception mode to put the reception system circuits into operation, and makes the circuits amplify and demodulate the reception signal. And, the control circuit 260 executes the switching control in answer to the reception signal for the GSM or the reception signal for the DCS/PCS.

When the reception mode is ended, the base band circuit 300 supplies the RF IC 200 with the command to demand the warm-up mode, "Synthesizer Control Word", including the value (frequency information of usable channels) being set to the counter 322 and the counter 323. Then, the control circuit 260 enters the warm-up mode, selects the usable band of the RFVCO 250 and sets the frequency value to the counter 322 and the counter 323, on the basis of the frequency information from the base band circuit 300 and the frequency measurement result stored in the register. And the control circuit 260 puts the RFVCO 250 and the IF VCO 230 into the oscillation operation, and brings the RF PLL loop and the IF PLL loop into the lock-in state.

Thereafter, when the RF IC 200 receives "Transmitter Control Word" to demand the transmission operation from the base band circuit 300, the control circuit 260 enters the transmission mode, selects the usable band of the TXVCO 240 on the basis of the frequency information from the arithmetic circuit 38 and the frequency measurement result stored in the register 37, and operates the TXVCO 240a or the TXVCO 240b. Further, the control circuit 260 controls the conformable band determination circuit 39 to read out the current correction value corresponding to the selected band from the register 37 and send the current correction value to the charge pump 237a and correct the current Icp, and brings the transmission PLL into the lock-in state to modulate and amplify the transmission signal. And, the control circuit 260 turns on a transmission switch SW4, and executes the switching control of the TXVCO in answer to the transmission signal for the GSM or the reception signal for the DCS/PCS. The use of either the TXVCO 240a or the TXVCO 240b is determined by a predetermined code contained in the command that the base band circuit 300 supplies.

On the lower half of FIG. 11 is shown the detailed timing of the frequency measurements of the IFVCO 230, TXVCO 240a, and TXVCO 240b, which are executed during the time slot "$7" of the "Initial State". As shown in FIG. 11, when the predetermined command "Word 7" is inputted, the measurement of the current Icp of the current source of the charge pump and the frequency measurement of the IFVCO are started. When the frequency measurement of the IFVCO is ended, the frequency measurement of each band #0~#14 of the TXVCO 240a (GSM) and the frequency measurement of each band #0~#14 of the TXVCO 240b (DCS) are sequentially executed (period T2). Thereafter, in order to detect the dispersion of the KV value of the TXVCO, the frequency measurement (period T3) of band #15 of the TXVCO 240a (GSM) at Vt=0 V and the frequency measurement (period T4) of band #15 of the TXVCO 240b (DCS) at Vt=2.8 V are sequentially executed.

And, the conformable band selection signals VB2'~VB0' determined on the basis of these measurement values are supplied to the IFVCO at the start of the transmission mode; the conformable band selection signals VB3~VB0 and the current correction values of the charge pump determined on the basis of the measurement values are supplied to the TXVCO at the start of the transmission mode. The frequency measurement value acquired by the measurement for determining the conformable band being executed during the period T2 at the control voltage Vt=1.0 V is also used as the frequency measured for correcting the deviation of the KV value due to the capacitance dispersions of the band switching capacitors C11~C42.

Thus, the invention made by the inventors being described in detail based on the embodiment, the invention is not limited to the above descriptions. In the above embodiment, for example, the frequency measurement of the TXVCO 240a, TXVCO 240b is carried out by using the counter 322 and counter 323 prepared for the IFVCO 230, however the measurement may be made by using the counter prepared for the RFVCO 250. And, instead of executing the frequency measurement of the TXVCO 240a, TXVCO 240b to all the bands, it may be arranged to execute the measurement of only the odd bands or the even bands, and to acquire the frequencies of unmeasured bands through calculating the averages of the frequency measurement values of the bands before and behind. In the embodiment, the band number of the IFVCO 230 was 8, but it may be 4 or 16 or the like.

The band number of the TXVCO 240a, TXVCO 240b is not limited to 16, and it may be 8 or 32 or the like.

Further, the above embodiment carries out the frequency measurement of the TXVCO 240a, TXVCO 240b by using the variable frequency divider 32 prepared for the IFVCO 230, in view of restraining the circuit scale from increasing. However, it may be arranged to separately prepare a variable frequency divider (counter) for carrying out the frequency measurement of the TXVCO 240a, TXVCO 240b, and to carry out the frequency measurement of the TXVCO 240a, TXVCO 240b in parallel to the frequency measurement of the IFVCO 230, in response to one command. To add the above counter will slightly increase the circuit scale, but it will finish the frequency measurement of plural VCOs in a shorter time.

Further in the description of the above embodiment, the count '1' of the correction value for correcting the deviation of the KV value was correspondent to 1% of the current Icp of the current source of the charge pump; however, the invention is not restricted to this. It does not matter at all whether the count '1' of the correction value corresponds to 0.5% or 0.8% or the like of the current Icp of the current source of the charge pump.

The above embodiment has been described mainly with the case in which the invention made by the inventors is applied to the RF IC used for the radio communication system of a mobile telephone capable of the EDGE system communication, which is the applicable field to background the invention. However, the invention is not restricted to the RF IC of the EDGE system, but the invention can also be applied to a transmission VCO of the RF IC having the transmission system circuit that adopts the so-called polar loop system including the phase control loop and the amplitude control loop as the modulation method, in which the RF IC executes the modulation such as the 16 QAM or the 64 QAM for a radio LAN, requiring the phase modulation and the amplitude modulation.

What is claimed is:

1. A mobile communication device such as a mobile telephone, comprising:
    an antenna;
    an antenna switch which couples the antenna and switches a transmission signal and a reception signal;
    a communication semiconductor integrated circuit which couples the antenna switch and which demodulates the reception signal and modulates the transmission signal;
    a power amplifier which couples between the antenna switch and the communication semiconductor integrated circuit device and which amplifies a signal to be transmit from the communication semiconductor integrated circuit device and outputs the transmission signal,
    wherein the communication semiconductor integrated circuit device comprises:
    a phase control loop, including:
    a transmission oscillator which receives a control voltage for determine a oscillation frequency of the transmission oscillator and outputs a phase modulated signal,
    a phase comparator which compares a phase of an output signal from the transmission oscillator and a phase of a phase and amplitude modulated signal; and
    a charge pump which generates the control voltage according to an output of the phase comparator, and
    an amplitude control loop, including an amplitude comparator which compares an amplitude of the transmission signal and an amplitude of a phase and amplitude modulated signal (TXIF) and which generates a voltage according to an amplitude difference and outputs the voltage to the power amplifier as an output level control signal,
    wherein a variation of the control voltage versus oscillation frequency characteristic of the transmission oscillator is corrected by calibrating a current of the charge pump.

2. A mobile communication device according to claim 1, wherein the transmission oscillator is capable of an oscillation operation in a plural frequency band.

3. A mobile communication device according to claim 1, wherein the current of the charge pump is calibrated in a manner that, when a value of an oscillation frequency range divided by control voltage range in each frequency band of the transmission oscillator is given by Kv, and a current value of the charge pump is given by Icp, a product value of Kv and Icp falls into a predetermined range.

4. A mobile communication device according to claim 3, the communication semiconductor integrated circuit device further comprising:
    a frequency measurement circuit which measures the oscillation frequency of the transmission oscillator;
    a storage circuit which stores frequency information measured in each frequency band of the transmission oscillator by the frequency measurement circuit; and
    an arithmetic circuit that calculates a correction value of the current of the charge pump based on oscillation frequency measurement values at two predetermined control voltages of the transmission oscillator.

5. A mobile communication device according to claim 4, wherein each of the correction value of the current of the charge pump correspond to the oscillation frequency measurement values are stored as table data in the storage means.

6. A mobile communication device according to claim 5, wherein the transmission oscillator includes a variable capacitors which are controlled by the voltage generated by the charge pump, plural set-capacitance capacitors, and a switch circuit capable of connecting and disconnecting the set-capacitance capacitors, in which the switch circuit switches a connection number of the set-capacitance capacitors to thereby vary the oscillation frequency band, and wherein the current correction values of the charge pump corresponding to the oscillation frequency bands each are stored in the storage means.

7. A mobile communication device according to claim 6, wherein the correction value includes a value to correct a variation of the Kv value due to a capacitance dispersion of the variable capacitor, and a value to correct a variation of the Kv value due to a capacitance dispersion of the set-capacitance capacitor.

8. A mobile communication device according to claim 7, wherein the frequency measurement of the transmission oscillator by the frequency measurement circuit is executed when the power supply is inputted and during a period in which both a transmission operation and a reception operation are deactivated.

9. A communication semiconductor integrated circuit device according to claim 1, wherein the transmission oscillator includes a first oscillator that generates the transmission signal of the GSM system, and a second oscillator that generates the transmission signals of the DCS system and the PCS system.

10. A mobile communication device according to claim 9, the communication semiconductor integrated circuit device further comprising:

a third oscillator that generates a signal of an intermediate frequency, and a modulation circuit that executes an orthogonal modulation to the signal of an intermediate frequency generated by the third oscillator by means of I, Q signals generated based on transmission data, wherein the phase modulated and amplitude modulated signal by the modulation circuit is supplied to the phase comparator and the amplitude comparator.

11. A mobile communication device according to claim 10, wherein the frequency measurement circuit measures an oscillation frequency of the transmission oscillator or the first oscillator and the second oscillator, and an oscillation frequency of the third oscillator.

\* \* \* \* \*